United States Patent [19]
Sugiura et al.

[11] Patent Number: 6,140,675
[45] Date of Patent: Oct. 31, 2000

[54] SEMICONDUCTOR DEVICE AND MANUFACTURING METHOD THEREOF

[75] Inventors: Soichi Sugiura; Hisashi Watanobe, both of Mie-ken, Japan

[73] Assignee: Kabushiki Kaisha Toshiba, Kanagawa-Ken, Japan

[21] Appl. No.: 09/366,357

[22] Filed: Aug. 3, 1999

[30] Foreign Application Priority Data

Aug. 6, 1998 [JP] Japan ................... 10-223311

[51] Int. Cl.$^7$ ................. H01L 27/108; H01L 29/76
[52] U.S. Cl. .................................... 257/301; 257/304
[58] Field of Search ................... 257/301, 304

[56] References Cited

U.S. PATENT DOCUMENTS 5,670,805 9/1997 Hammerl et al. .
5,869,868 2/1999 Rajeevakumar .
5,905,279 5/1999 Nitayama et al. .
6,034,390 3/2000 Tews .

*Primary Examiner*—Stephen D. Meier
*Attorney, Agent, or Firm*—Hogan & Hartson, LLP

[57] ABSTRACT

A semiconductor device provided with a thin film of 0.1 nm to 2 nm in thickness, having a crystal structure different from that of a conductor and a semiconductor region, between the conductor and the semiconductor region. When the semiconductor region is made of single crystal silicon and the conductor region is made of amorphous silicon or poly silicon, the oxygen surface concentration of the thin film is equal to or higher than $1 \times 10^{15}$ cm$^{-2}$ and equal to or lower than $4 \times 10^{15}$ cm$^{-2}$ in one case, that of oxygen is equal to or higher than $1 \times 10^{15}$ cm$^{-2}$ and equal to or lower than $2 \times 10^{15}$ cm$^{-2}$ and that of nitrogen is equal to or higher than $1 \times 10^{15}$ cm$^{-2}$ and equal to or lower than $4 \times 10^{15}$ cm$^{-2}$ in the other case. The presence of the thin film prevents the epitaxial growth from starting from the interface between the conductor and the semiconductor region and reduces the crystal defect formation and growth near the interface.

16 Claims, 20 Drawing Sheets

SEMICONDUCTOR DEVICE AND MANUFACTURING METHOD THEREOF

BACKGROUND OF THE INVENTION

1. Filed of the Invention

The present invention relates to a semiconductor device requiring a high level integration such as dynamic RAMs (DRAMs) and a manufacturing method thereof, and more particularly, a semiconductor device having a structure for realizing a good electric connection between an buried conductor and a semiconductor region and a manufacturing method thereof.

2. Description of the Related Art

In recent years, semiconductor integrated circuits are integrated in larger and larger scale and, more particularly, DRAMs having a high integration by giga bits are demanded. According to such higher integration of semiconductors, the semiconductor devices are developed into three-dimensional structure from two-dimensional structure as before and a technology for obtaining a contact region substantially equal to or higher than the conventional one are adopted there to within a projective region smaller in two-dimensional plane than before. Usually, the DRAM memory cell of one transistor cell design is composed of a charge storage capacitor section defined in a semiconductor substrate or in an interlayer insulation film and an access transistor connected to this charge storage capacitor section. As the memory cell is made smaller, the structure of a connection section between a main electrode region of the access transistor and the charge storage capacitor section is realized smaller. In this situation, many modifications are proposed for the structure of this connection section and the manufacturing process thereof.

Now, the problems of the substrate contact of the conventional DRAM will be described in respect of a connection section between the charge storage capacitor section and the source region of the access transistor as follows.

FIG. 1 is a cross-section views of a part of memory cell section of a DRAM. A access transistor comprising an n$^+$ source region 61 and an n$^+$ drain region 62 is disposed on a p$^-$ well 52. Moreover, at the left of the n$^+$ source region 61, one conductor 55 as one electrode of the charge storage capacitor section (trench capacitor), partially not illustrated, and another conductor 56 above it are situated as same electrode, and the n$^+$ source region 61 and the trench capacitor are electrically connected by an n$^+$ buried contact 69. Further, to insulate with other memory cell access transistor, an isolation insulation film 2 (STI region) is disposed around each memory cell (a part thereof is shown at the left of the charge storage capacitor section in FIG. 1). The n$^+$ drain region 62 and a bit line 92 are mutually connected through a contact plug 12. In this structure, the n$^+$ buried contact 69 and the p$^-$ well 52 are reverse biased to prevent current flow.

However, according to the study of the inventors, a leakage current has sometimes produced near the n$^+$ buried contact 69. The generation of this leakage current lets the electric charge accumulated in the charge storage capacitor section run into the n$^+$ drain region 62 despite opening/ closing of the access transistor and results in a malfunction. Therefore, the inventors have studied in detail the cause of this leakage current. As the result, we have found that the cause of leakage current near the n$^+$ buried contact 69 is the fact that a crystal defect 202 is produced at and near the n$^+$ buried contact 69, and a leakage current has been produced along this crystal defect.

The observation of etch pits or scanning electron microscope (SEM) observation or the like shows that the crystal defect 202 appears at the buried contact 69 and extends to the p$^-$ well 52. A crystal defect 201 generates also at the conductor 56. They show also that the defect appeared in the buried contact 69 is formed continuously from the crystal defect 201 appeared in the conductor 56. Even when this crystal defect 202 does not attain an interface between the buried contact 69 and the p$^-$ well 52, it may provoke leakage current when it attains only an depletion region in the buried contact 69. Note that the measurement of this leakage current allows to screen the fault of a semiconductor device. As the defect, causing such leakage current, only appears and grows by a heat treatment more than 900° C., a semiconductor screening before shipment to the market allows to prevent the defect appearing in the market.

Now the formation steps of such defect will be described according to the manufacturing process. As the conductor 56 during the formation is amorphous (a-Si), crystal defect is absent. The crystal defect does not exists at the p$^-$well 52 in the buried contact 69, too. Here, the conductor 56 crystallizes by repeating several times a heat treatment of about 900° C. to form the buried contact 69, to form a gate oxide film, to activate or reflow the n$^+$ source region 61 or the like. This crystallization, beginning from the interface between the a-Si 56 (conductor) and the silicon (buried contact) 69, develops so as to grow epitaxialy towards the inside of the conductor 56. According to the crystallization of the a-Si 56, the internal stress of the conductor increases so as to relieve, resulting in the formation of a crystal defect 201 in the conductor 56. The internal stress will be propagated through this crystal defect to the buried contact 69, which has served as substrate for the epitaxial growth, forming a crystal defect 202. Finally, the crystal defect 202 pierces through the buried contact 69 and attains a p$^-$ well 52.

SUMMARY OF THE INVENTION

First, to clarify the problems, the crystal defect formation mechanism will be examined. Then, (a) the crystal defect formation process by the development of an epitaxial growth depending on different directions on a conductor, and (b) the extension process of the formed crystal defect to the buried contact 69, will be examined separately.

(a) The epitaxial growth starts from the interface with the semiconductor region by the fact that amorphous silicon or polycrystalline silicon used as conductor comes into contact with the semiconductor region, and is submitted to various heat treatments required for the semiconductor device manufacturing. According to the study by the inventors, this epitaxial growth starts from a temperature of about 900° C. Moreover, an internal stress appears during the heat treatment due to the difference between the thermal expansion rate of surrounding an isolation insulation film 2 (STI region) or the like and that of the conductor 56.

The place of crystal defect formation depends on the configuration of the conductor and semiconductor region interface, and it is often observed at corners of the conductor. This will be described with a simplified structure shown in FIG. 2A. Here, suppose that a conductor 56 is embedded in a pit formed on a first semiconductor region and a second semiconductor region wherein the plan orientation of a main surface is the (100) face. Moreover, suppose that a semiconductor region crystal face (100) appears at the pit bottom, while a semiconductor region crystal face (110) appears at the pit side. In this state, when the conductor 56 is heat treated, the epitaxial growth starts from respective interfaces with the pit bottom and sides. There, the growth rate from the pit bottom upward ((100) direction) and that from the side laterally ((110) direction) are different each other. In other words, growth faces presenting different face orientations collide one the other, causing the crystal structure irregularity on this interface.

(b) Next, the heat treatment makes the crystal defect develop. This will be described with a simplified structure shown in FIG. 2B. Consequently, during heat treatment processes of the predetermined semiconductor region manufacturing process, a crystal defect appears also on the second semiconductor 61. Moreover, stress often appears at the interface with a interlayer insulation film or the interface with an element separating insulation film in the second semiconductor region serving usually as epitaxial growth substrate, and this stress has an additional effect to accelerate the crystal defect propagation.

From the two steps mentioned above, one can understand that it is necessary to prevent the conductor epitaxial growth from starting from the conductor and semiconductor region interface, in order to control the crystal defect formation and growth.

Based on these findings, the present invention is, first, characterized by that a semiconductor device comprises at least a first semiconductor region of a first conductivity type, a second semiconductor region of a second conductivity type joined with the upper side of the first semiconductor, a third semiconductor region of the second conductivity type joined with the lower side of the first semiconductor, a conductor region embedded in the first and third semiconductor regions and being adjacent to the second semiconductor region, a thin film disposed at an interface between the conductor region and the second semiconductor region and having a crystal structure different from those of the conductor region and the second semiconductor region, and an insulation film disposed at an interface between the first and third semiconductor regions. Here, the first conductivity type and the second conductivity type are opposite conductivity type s each other. For example, if the first conductivity type is n type, the second conductivity type is p type, and if the first conductivity type is p type, the second conductivity type is n type. Additionally, the first semiconductor region may be a semiconductor substrate it-self, or may be a well region. The representative materiel of the first and second semiconductor regions includes, for example, single crystal silicon or single crystal gallium arsenide (GaAs) or others. As the application range, it is preferable to use, for example, amorphous silicon or poly silicon, or others as conductor material, if the first and second semiconductor regions are made of monocrystal silicon. However, metals may also be used provided that they allow the epitaxial growth. By "an insulation film disposed at the interface between the conductor region and the first semiconductor region", for instance, a color oxide film or capacitance insulation film or the like may be supposed.

According to the first feature of the present invention, as this film has a crystal structure different from that of the conductor region or the second semiconductor region, the epitaxial growth will not start from the interface between the conductor and the second semiconductor region.

Moreover, according to the first feature of the present invention, in a structure wherein a conductor embedded in the trench comes into contact with a semiconductor region, the epitaxial growth from starting from the interface between the conductor and the semiconductor region is inhibited. As the consequence, it can reduce crystal defect formation and growth at the interface between the conductor and the semiconductor region, and reduce the pn junction leakage current generation provoked by the crystal defect. For this effect, more particularly, the pn junction leakage current can be reduced in a dynamic RAM (DRAM) having a trench structure.

Preferably, the thickness of the thin film according to the first feature of the present invention is comprised between 0.1 nm and 2 nm. It is undesirable that the thin film thickness be equal to or higher than 2 nm, because the ohmic contact between the conductor and the second semiconductor region will be inhibited. Particularly, it is preferable that the thin film thickness be equal to or lower than 1 nm to obtain a good ohmic contact between the conductor and the second semiconductor region. Moreover, in respect of a process where a buried contact is formed by a self alignment process, a thin film thickness equal to or higher than 2 nm is undesirable, because this thin film will inhibit the diffusion. Here, the film thickness means the average film thickness. As the consequence, a film apparently thinner than one atom layer such as 0.1 nm or the like, namely, even an irregular thin film allows to obtain the effect of the present invention.

Preferably, the second semiconductor region according to the first feature of the present invention serves as one main electrode region of a transistor composing a memory cell, and the conductor as one electrode of a charge storage capacitor section. By so doing, the first feature of the present invention can be applied to the DRAM.

According to the second feature of the present invention, a semiconductor device comprises at least a first semiconductor region of a first conductivity type, a second semiconductor region of a second conductivity type joined with the first semiconductor and having a pit disposed on the surface, a conductor region embedded in the pit, and a thin film disposed at an interface between the conductor region and the second semiconductor region and having a crystal structure different from those of the conductor region and the second semiconductor region. Here, as mentioned for the first feature, the first conductivity type and the second conductivity type are opposite conductivity type s each other. Additionally, the first semiconductor region may be a semiconductor substrate it-self, or may be an well region. As the application range, it is preferable to use, for example, amorphous silicon or poly silicon as conductor material, if the first and second semiconductor regions are made of single crystal silicon. However, metals may also be used provided that they allow the epitaxial growth.

According to the second feature of the present invention, as the film has a crystal structure different from that of the conductor region or the second semiconductor region, the epitaxial growth will not start from the interface between the conductor and the second semiconductor region. As the consequence, in a structure wherein the interface of the conductor and the semiconductor region is situated in a pit disposed in the semiconductor region, it can reduce crystal defect formation and growth at the interface between the conductor that will constitute an electrode section and the transistor main electrode region, and reduce the pn junction leakage current generation provoked by the crystal defect. Consequently, the characteristics of semiconductor devices such as high integration degree semiconductor integrated circuits or high frequency transistors or the like where a good electric connection of electrode sections is required in a fine structure, can be improved.

Preferably, the thickness of the thin film according to the second feature of the present invention is comprised between 0.1 nm and 2 nm. It is undesirable that the thin film thickness be equal to or higher than 2 nm, because the ohmic contact between the conductor and the second semiconductor region will be inhibited. Particularly, it is preferable that the thin film thickness be equal to or lower than 1 nm to obtain a good ohmic contact between the conductor and the second semiconductor region. Here, the film thickness means the average film thickness, so a film thinner than one atom layer, namely, even an irregular thin film allows to obtain the effect of the present invention.

Preferably, the oxygen surface concentration of thin film according to the first and second features of the present invention is equal to or higher than $1\times10^{15}$ cm$^{-2}$ and equal to or lower than $4\times10^{15}$ cm$^{-2}$. This is because, according to an experimental confirmation, leakage current will occur when the oxygen surface concentration is lower than $1\times10^{15}$ cm$^{-2}$. It is supposed that when the oxygen surface concentration is less than $1\times10^{15}$ cm$^{-2}$, the thin film lattice constant does not change much in respect of the lattice constant of the second semiconductor region and epitaxial growth of the conductor will occur on this thin film. When the oxygen surface concentration is more than $4\times10^{15}$ cm$^{-2}$, the contact resistance between the conductor and the second semiconductor region increases, and the semiconductor device's driving speed reduces. It is supposed that the higher oxygen surface concentration, the higher contact resistance, so the thin film is thicker.

Moreover, preferably, the oxygen surface concentration of thin film according to the first and second features of the present invention is equal to or higher than $1\times10^{15}$ cm$^{-2}$ and equal to or lower than $2\times10^{15}$ cm$^{-2}$ and the nitrogen surface concentration is equal to or higher than $1\times10^{15}$ cm$^{-2}$ and equal to or lower than $4\times10^{15}$ cm$^{-2}$. A thin film containing nitrogen can lower the electron barrier, allowing to reduce the contact resistance between the semiconductor region and the conductor produced by the intervention of the thin film. This is because, according to an experimental confirmation, leakage current will occur when the oxygen surface concentration is lower than $1\times10^{15}$ cm$^{-2}$ and the nitrogen surface concentration is lower than $1\times10^{15}$ cm$^{-2}$. It is supposed that when the surface concentration of oxygen and nitrogen are less than $1\times10^{15}$ cm$^{-2}$, the thin film lattice constant does not change much in respect of the lattice constant of the second semiconductor region and epitaxial growth of the conductor will occur on this thin film. When the oxygen surface concentration is more than $2\times10^{15}$ cm$^{-2}$ and the nitrogen surface concentration is more than $4\times10^{15}$ cm$^{-2}$, the contact resistance between the conductor and the second semiconductor region increases, and the semiconductor device's driving speed reduces. It is supposed that the higher surface concentration of oxygen and nitrogen, the higher contact resistance, so the thin film is thicker.

According to the third feature of the invention, a method for manufacturing semiconductor devices, comprising the steps of forming a pit in a semiconductor region, forming a thin film of which crystal structure is different from that of the semiconductor region on the surface of this pit, and embedding a conductor in the pit. In this composition, as the thin film has a crystal structure different from that of the conductor region and the semiconductor are, epitaxial growth will not start from the interface between the conductor and the semiconductor region. This allows to reduce the formation and propagation of crystal defect near the interface between the conductor and the semiconductor region. Consequently, the pn junction leakage current generation caused by this crystal defect can be reduced.

According to the fourth feature of the invention, a method for manufacturing semiconductor devices, comprising the steps of forming a pit in a first semiconductor region, forming a thin film of which crystal structure is different from that of the first semiconductor region on the surface of this pit, embedding a conductor in the pit, and forming a second semiconductor region of a second conductivity type coming into contact with the thin film, in the first semiconductor region. In this composition, as the thin film has a crystal structure different from that of the conductor region and the second semiconductor are, epitaxial growth will not start from the interface between the conductor and the second semiconductor region. This allows to reduce the formation and propagation of crystal defect near the interface between the conductor and the semiconductor region. Consequently, the pn junction leakage current generation caused by this crystal defect can be reduced.

The process for forming the thin film according the third and fourth features of the present invention comprises preferably the steps of controlling the furnace temperature in the range from 300° C. to 450° C., introducing nitrogen into the furnace, evacuating the furnace inner pressure up to about 0.13 Pa, stopping the introduction of nitrogen into the furnace and evacuating oxygen from the furnace, keeping the state of pressure range from 133 Pa to 4 kPa, within the temperature range from 600° C. to 800° C., during the time range form 5 min to 60 min, while introducing ammonia into the furnace. If the semiconductor region is made of silicon, this allows to form a nitride oxide film as thin film. In other words, a nitride oxide film can be formed with the oxygen surface concentration equal to or higher than $1\times10^{15}$ cm$^{-2}$ and equal to or lower than $2\times10^{15}$ cm$^{-2}$ and the nitrogen surface concentration equal to or higher than $1\times10^{15}$ cm$^{-2}$ and equal to or lower than $4\times10^{15}$ cm$^{-2}$. Silicon is oxidized to form a thermal oxide film in the evacuating step, and the thermal oxide film is nitrified in the maintaining step.

Additionally, a process for forming the thin film according the third and fourth features of the present invention, comprising the steps of controlling the furnace temperature in the range from 400° C. to 550° C., introducing nitrogen into the furnace, and evacuating the furnace inner pressure up to the range from 20 kPa to 30 kPa, stopping the introduction of nitrogen into the furnace and evacuating oxygen from the furnace. If the semiconductor region is made of silicon, this allows to form a thermal oxide film as thin film. In other words, a thermal oxide film can be formed with the oxygen surface concentration equal to or higher than $1\times10^{15}$ cm$^{-2}$ and equal to or lower than $4\times10^{15}$ cm$^{-2}$.

Other and further objects and features of the present invention will become obvious upon an understanding of the illustrative embodiments about to be described in connection with the accompanying drawings or will be indicated in the appended claims and various advantages not referred to herein will occur to one skilled in the art upon employing of the invention in practice.

BRIEF DESCRIPTION OF THE DRAWINGS

FIG. 2 is a schematic cross section illustrating the formation process of crystal defect. FIG. 2A is a cross section illustrating the crystal defect formation process, while

DETAILED DESCRIPTION OF THE EMBODIMENTS

Figure 1:
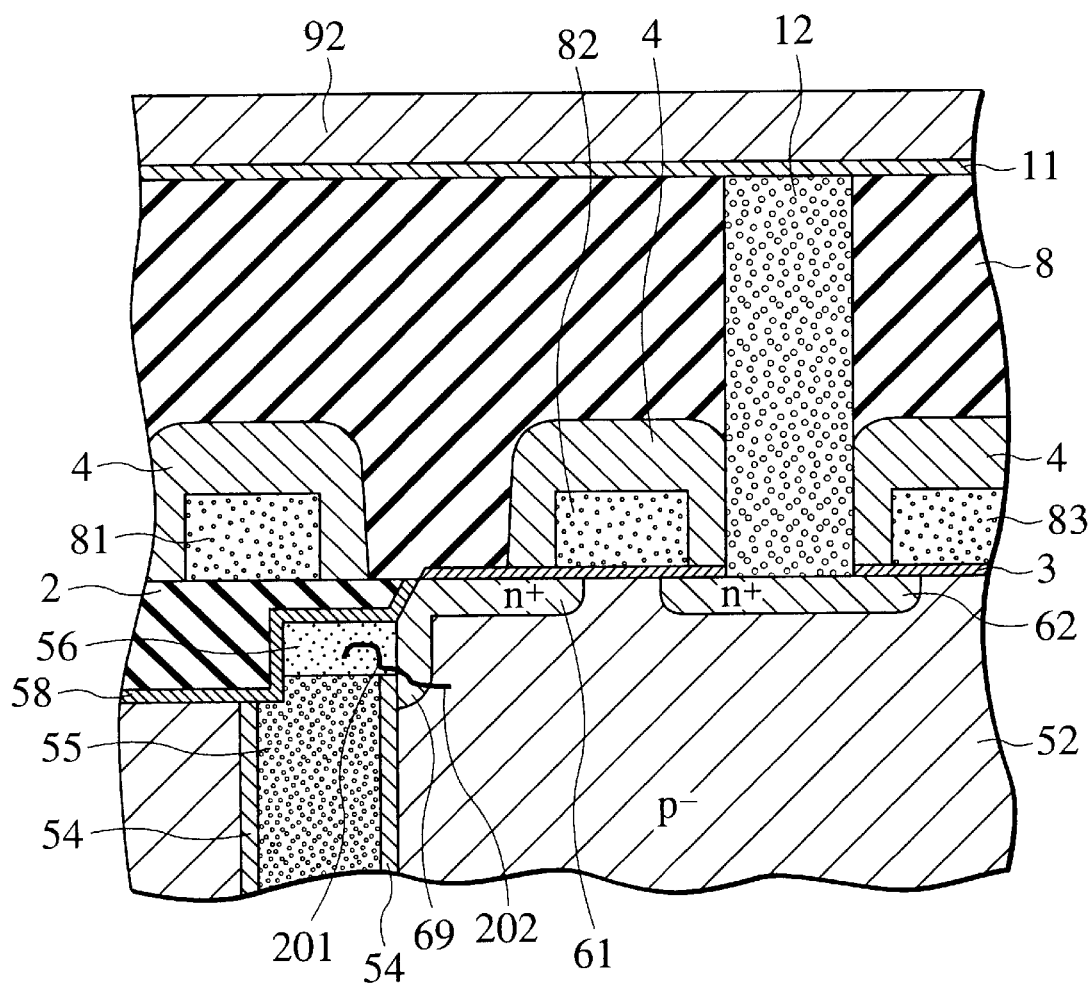
FIG. 1 is a cross section of a conventional semiconductor device (DRAM)
Figure 2A:
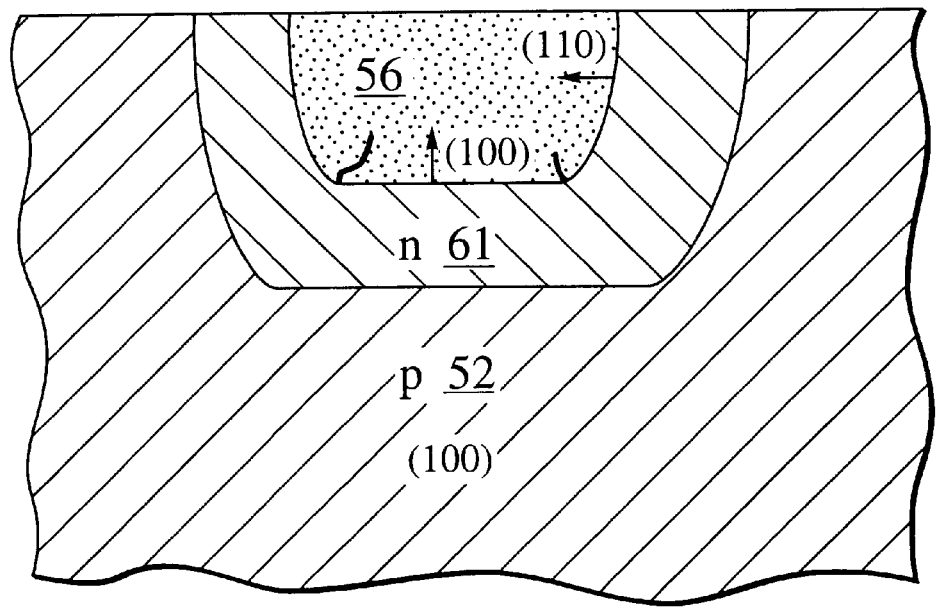
Figure 2B:
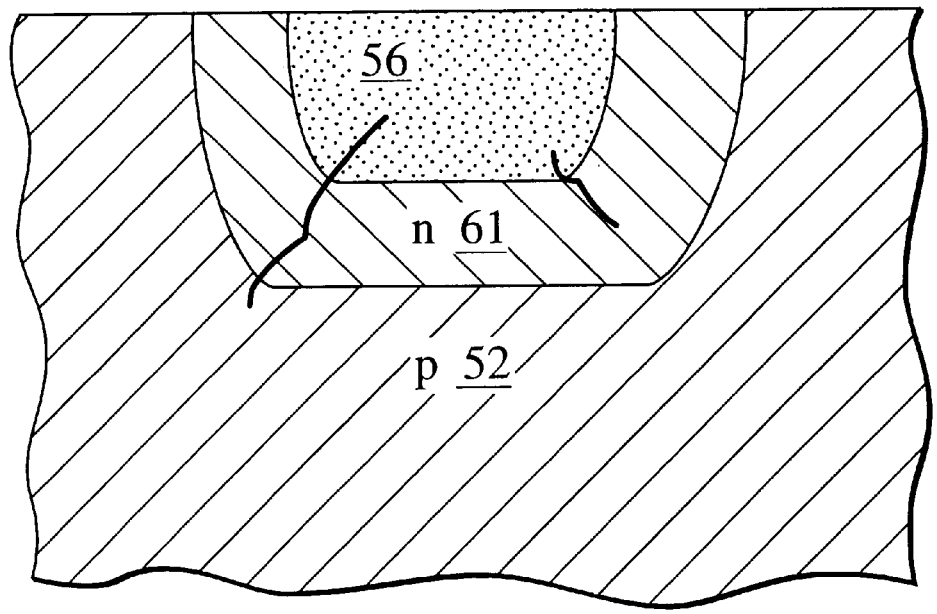
FIG. 2B is a cross section illustrating the crystal defect growth process.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. However, it is to be noted that drawings are schematic and the relation between the thickness and the plane dimensions, the thickness proportion of respective layer may be different from the reality. Consequently, the specific thickness or dimensions are to be judged from the following description. Obviously, the drawings may include portions where the relation or proportion of respective dimensions are different each other.
(First Embodiment)

Figure 3:
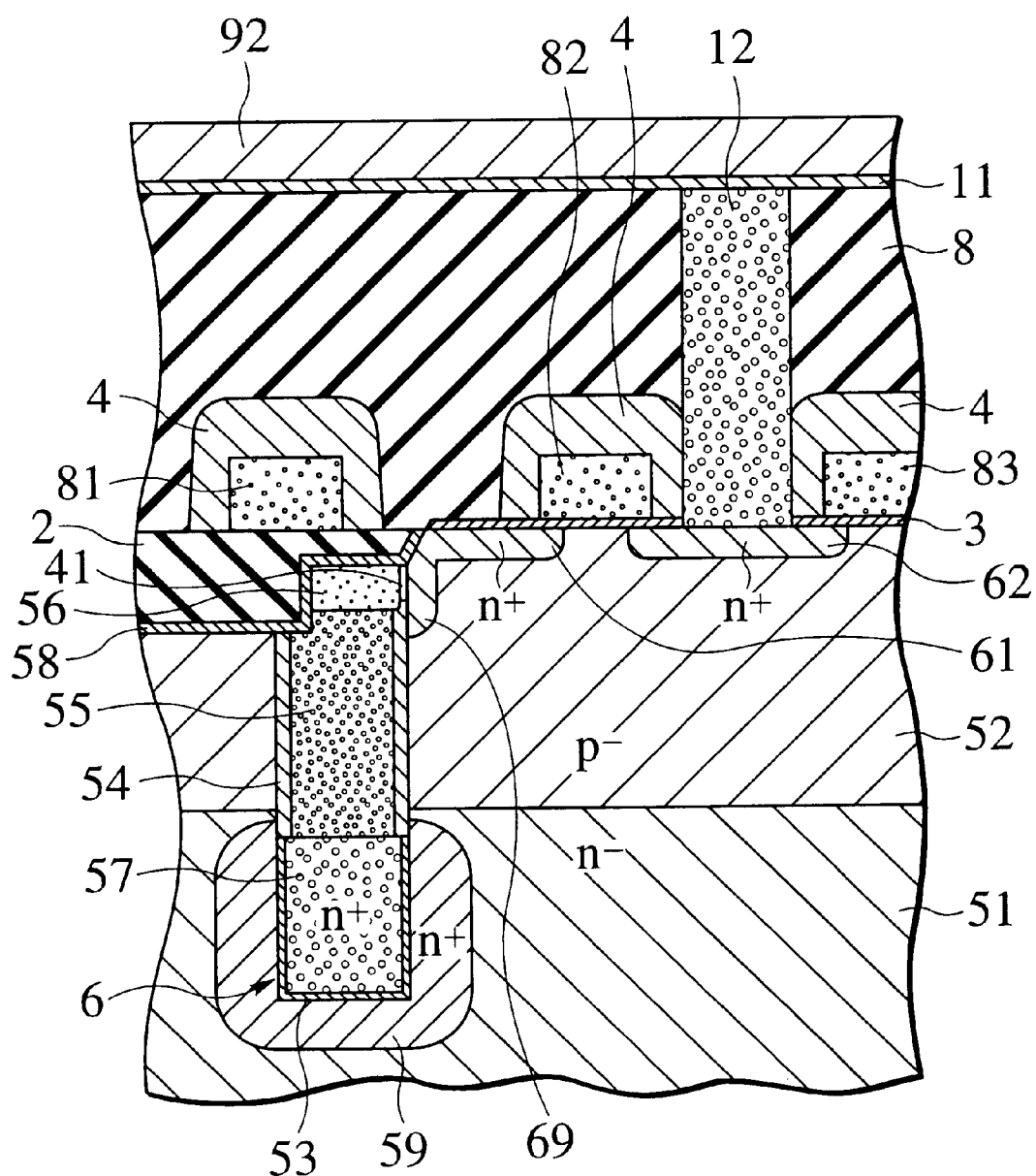
FIG. 3 is a cross section of a DRAM according to a first embodiment of the present invention.

FIG. 3 is a cross section of a DRAM according to a first embodiment of the present invention. The DRAM according to the first embodiment of the present invention is composed by arranging a number of memory device element (memory cell) in the form of X-Y matrix. Each memory cell is composed of one access transistor and one charge storage capacitor section (capacitor section). FIG. 3 is a partial view showing one memory cell among them. A contact plug 12 disposed at the center of these two memory cells is connected to a bit line 92 extending to the left and to the right. At the left of the central contact plug 12, an access transistor composed of an $n^+$ source region 61 and an $n^+$ drain region 62 is disposed. The $n^+$ silicon region including $n^+$ source region 61 includes a buried contact 69. Moreover, at the left of the $n^+$ source region 61, a charge storage capacitor section (trench capacitor section) 6 is situated, and $n^+$ source region 61 and the conductor 56 connected with the storage electrode of the charge storage capacitor are mutually connected by the buried contact 69. As shown in FIG. 3, the DRAM according to the first embodiment of the present invention has, as plate layer, an $n^-$ buried layer 51 formed on a p type (100) silicon substrate not illustrated. A $p^-$ well 52 is arranged on this plate layer, and a DRAM unit cell access transistor is composed, on the surface of the $p^-$ well 52. The contour of the $p^-$ well 52 is surrounded by a insulation film 2 of silicon oxide film or the like for device isolation, formed by the STI method or the like, and makes its inside active region. The $n^+$ source region 61 and $n^+$ drain region 62 of the access transistor is arranged on the surface of the $p^-$ well 52 in this active region. The $p^-$ well 52 between the $n^+$ source region 61 and $n^+$ drain region 62 of the access transistor will constitute a channel region. Gate electrodes 81, 82, 83 of poly silicon or the like are formed in the upper part of this channel region, through a gate oxide film 3. The poly silicon gate electrodes 81, 82, 83 serve also as word line, and extend in a direction orthogonal to the bit line 92. A silicon nitride film ($Si_3N_4$)4 is formed in a way to cover the gate electrodes 81, 82, 83. Moreover, an interlayer insulation film 8 such as boro-phospho silicate glass (BPSG) is formed on the silicon nitride film 4. And, a barrier metal 11 and a bit line 92 are arranged on the interlayer insulation film 8.

A contact plug 12 is connected to the superior part of the $n^+$ drain region 62 and the contact plug 12 is connected to the bit line 92. The contact plug 12 is embedded in a contact hall formed in the interlayer insulation film 8.

A trench more profound than the $n^-$ plate 51 is formed, passing through the $p^-$ well 52, in the proximity of the $n^+$ source region 61. A thermal oxide film, which will constitute a collar oxide 54, and a silicon nitric oxide film of 3 nm to 8 nm in thickness, which will constitute an capacitance insulation film 57, are formed on the trench inner wall. A first $n^+$ doped poly silicon (or doped amorphous silicon (a-Si)) 53, which will constitute an storage electrode exhibiting as same conductivity as that of the conductor 56 (so the storage electrode is a conductor.), formed on the surface of the collar oxide 54 and the capacitance insulation film 57 in a way to fill the trench. Tungsten (W), titanium (Ti), molybdenum (Mo) or other refractory metals or their refractory metal silicides ($WSi_2$, $TiSi_2$, $MoSi_2$) or the like may be used in place of the first $n^+$ doped poly silicon. It may well also be a stratified film (polycide film) of poly silicon and silicide film. An $n^+$ diffusion layer 59 is formed near the trench bottom. An storage electrode composed of the first $n^+$ doped poly silicon 53, the capacitance insulation film 57 and the $n^+$ diffusion layer 59 (the $n^+$ diffusion layer 59 may be understood as a part of the $n^-$ plate layer 51) composed the charge storage capacitor section (trench capacitor section) of the DRAM according to the first embodiment of the present invention. An storage electrode 53 of this trench capacitor section 6 and the $n^+$ source region 61 of the access transistor are connected by a second $n^+$ doped poly silicon (or doped amorphous silicon (a-Si)) 55 exhibiting as same conductivity as that of the conductor 56 (so the second $n^+$ doped poly silicon is a conductor.), the conductor (a third $n^+$ doped poly silicon or doped amorphous silicon (a-Si)) 56 and the $n^+$ buried contact 69. And it may be supposed that the first, the second and the third $n^+$ doped poly silicon 53, 55, 56 composes a conductor region, which constitutes a storage electrode.

Figure 4:
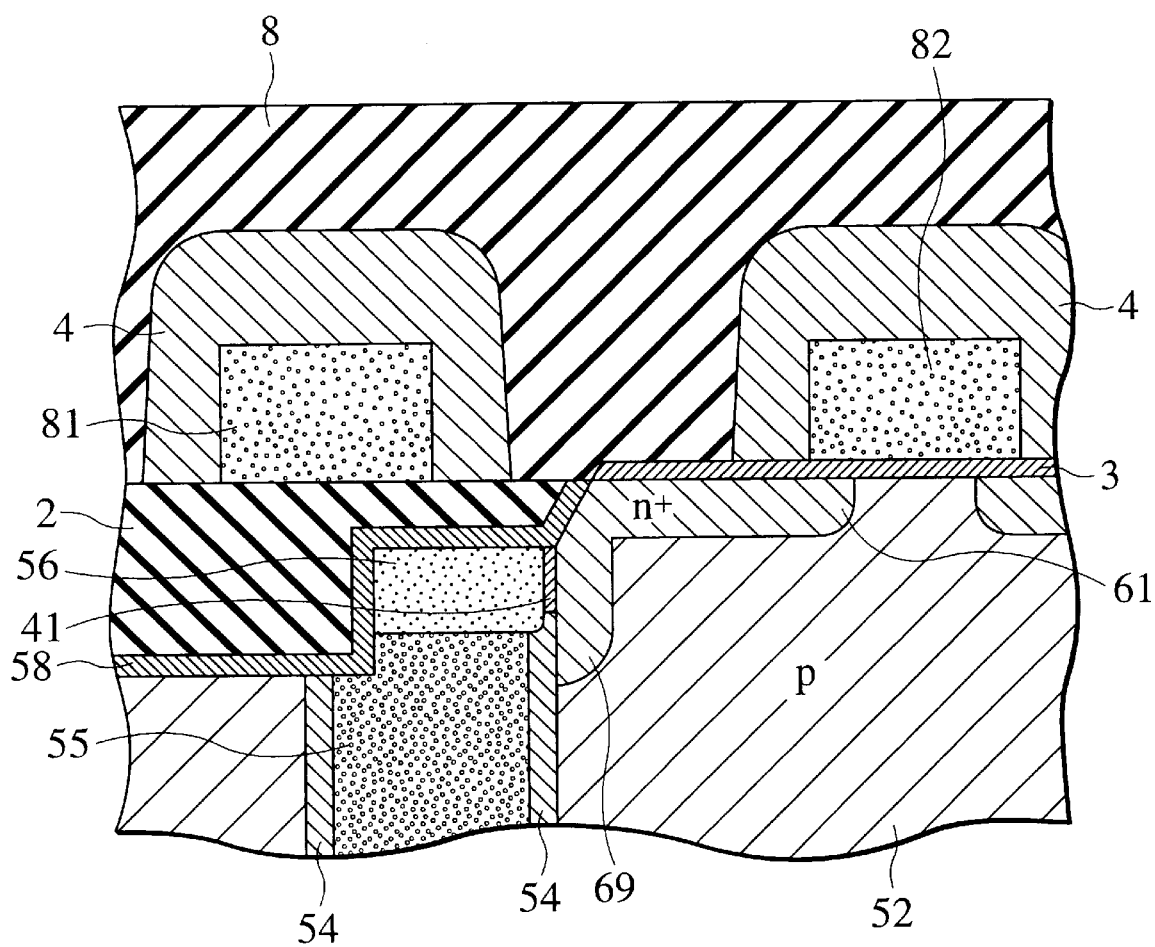
FIG. 4 is a cross section of a DRAM according to a first embodiment of the present invention, enlarging the periphery of a thin film.

FIG. 4 is a enlarged view of the periphery of the $n^+$ buried contact 69. And a thin film 41 according to the present invention formed between the conductor 56 and the $n^+$ buried contact 69. A collar oxide film (thick silicon oxide film) 54 is formed between the second $n^+$ doped poly silicon film 55 and the $p^-$ well 52. The collar oxide film 54 is a silicon oxide film for restraining leakage current caused by a parasite transistor formed between the $n^+$ source region 61 and the $n^+$ diffusion layer 59/$n^+$ plate layer 51.

The aforementioned composition permits to prevent the epitaxial growth from starting from the interface with the $n^+$ buried contact 69 in the conductor, by the presence of the thin film 41. Consequently, the formation of crystal defect caused by this epitaxial growth can be restrained and the leakage current in the proximity of the n$^+$ buried contact 69 can be reduced.

Preferably, the thickness of the thin film 41 is equal to or lower than 1 nm. It is undesirable that the thin film thickness be equal to or higher than 1 nm, because the ohmic contact will hardly be established. Note that a thin film of 0.1 nm in thickness means the average film thickness where the thin film 41 is formed irregularly, and the film thickness is thinner than one atom layer. Here, even an irregular thin film, provided that the thickness is equal to or higher than 0.1 nm, allows to obtain the effects of the present invention, such as inhibition of epitaxial growth.

It is also important that the surface concentration of oxygen appearing in the film cross section be equal to or higher than $1 \times 10^{15}$ cm$^{-2}$ and equal to or lower than $4 \times 10^{15}$ cm$^{-2}$. It is expressed by the oxygen surface concentration, because oxygen appearing on the thin film surface is counted by uniformly spattering the thin film surface with SIMS. Consequently, this value is supposed to the oxygen concentration in the thin film by one to one. This is because, according to an experimental confirmation, leakage current occurred when the oxygen surface concentration was lower than $1 \times 10^{15}$ cm$^{-2}$. It is supposed that when the oxygen surface concentration is less than $1 \times 10^{15}$ cm$^{-2}$, a lattice constant of the thin film 41 does not change much in respect of the lattice constant of the n$^+$ buried contact 69 and epitaxial growth of the conductor 56 will occur on this thin film 41. When the oxygen surface concentration is more than $4 \times 10^{15}$ cm$^{-2}$, the contact resistance between the conductor 56 and the n$^+$ buried contact 69 increases, and the semiconductor device's driving speed reduces. It is supposed that the higher oxygen surface concentration, the higher contact resistance, so the thin film is thicker. When the thin film 41 contains nitrogen, it is also important that the oxygen surface concentration of thin film is equal to or higher than $1 \times 10^{15}$ cm$^{-2}$ and equal to or lower than $2 \times 10^{15}$ cm$^{-2}$ and the nitrogen surface concentration is equal to or higher than $1 \times 10^{15}$ cm$^{-2}$ and equal to or lower than $4 \times 10^{15}$ cm$^{-2}$. As in the case where only oxygen is contained, this composition allows not only to inhibit the leakage current, but also to reduce the contact resistance, which would increase when only oxygen is contained.

The DRAM according to the first embodiment of the present invention can be manufactured by the following manufacturing process.

(a) First, the n$^-$ buried layer 51 is formed by implanting at acceleration energy of 1 to 10 MeV arsenic ions ($^{75}$As$^+$) into a p(100) substrate, and then annealing. It can also be formed by diffusion without using MeV class high acceleration energy ion implantation method. In this case, it is necessary to diffuse p$^-$ layer (p$^-$ well) 52 over the surface of the n$^-$ buried layer 51 diffusion layer. Alternatively, the n$^-$ buried layer 51 and the p$^-$ well layer 52 thereon can be piled up in the selective epitaxial growth. Next, a silicon oxide film is formed over the surface of the p$^-$ well 52. Then using photolithography, photoresist film is formed except the region where trench (U-shaped pit) is to be formed, an the silicon oxide film over the surface of the p$^-$ well 52 by electron cyclotron resonance (ECR) ion etching or reactive ion etching (RIE) using, for example, CF$_4$, CF$_4$/H$_2$ or C$_3$F$_8$ or the like.

A trench for forming a capacitor section of 5 to 10 μm depth is formed by ECR ion etching or RIE using CF$_4$, SF$_6$, CBrF$_3$, SiCl$_4$ or CCl$_4$ or the like as mask. It is also effective to cool the substrate from $-110°$ C. to $-130°$ C. during the trench etching.

Then, arsenic ($^{75}$As$^+$) ion is implanted into the bottom of this trench, to form an n$^+$ diffusion layer 59 near the trench bottom.

Figure 5A:
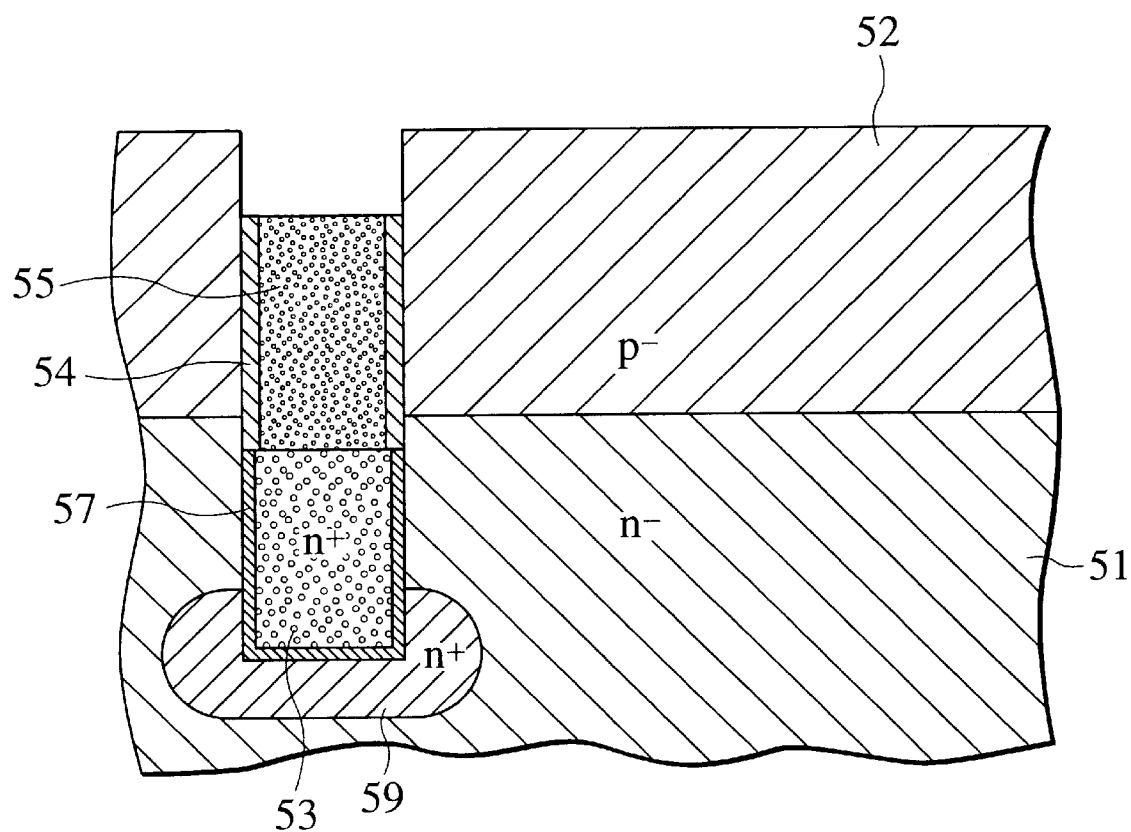
FIGS. 5A to 5G are cross sections concerning process diagrams illustrating a manufacturing method of a DRAM according to a first embodiment of the present invention.

(b) The, an NO film of 3 to 8 nm in thickness that will constitute a capacitance insulation film 57 is formed in this trench. Next, a first n$^+$ doped poly silicon 53 is embedded in the trench. Amorphous silicon (a-Si) may well replace the doped poly silicon 53. Thereafter, the first n$^+$ doped poly silicon 53 is etched back of about 1 μm by RIE. A thick collar oxide film 54 is formed by heat oxidation of this etched back trench inner wall. Thereafter, the oxide film in the superior portion of the n$^+$ doped poly silicon 53 is removed selectively using a highly directive RIE. The, a second n$^+$ doped poly silicon (or n$^+$ doped amorphous silicon (a-Si)) 55 is embedded. The first and second n$^+$ doped poly silicon 53, 55 can be embedded by the reduced pressure CVD. Thereafter, the upper portion of the second n$^+$ doped poly silicon 55 is etched back by the depth of the buried contact 69. Then, as shown in FIG. 5A, the exposed collar oxide film 54 will further be removed.

Figure 5B:
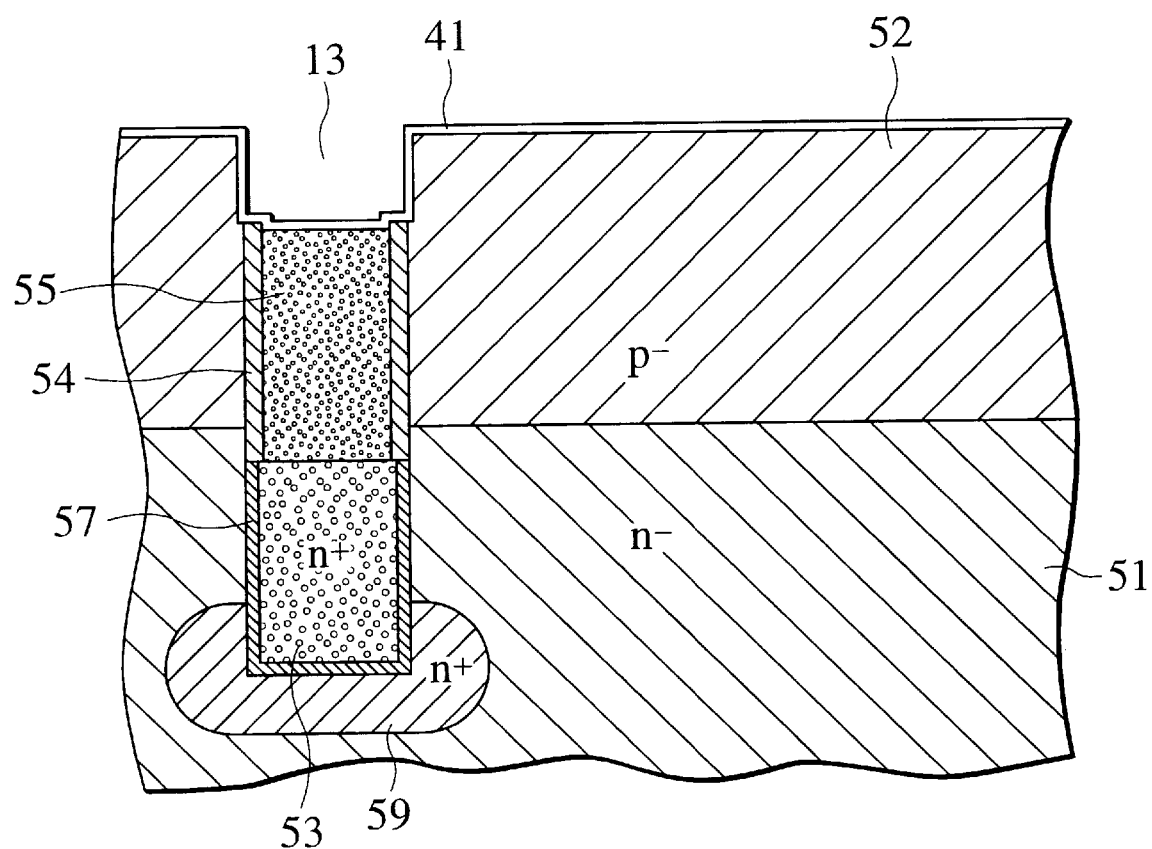

Then, as shown in FIG. 5B, a thin film 41 of 0.1 nm to 2 nm in thickness is formed at the upper portion of the trench. The thin film can be formed by oxidation and nitriding of the silicon surface using ammonia (NH$_3$) and nitrogen as carrier gas, or by silicon surface oxidation using oxygen and nitrogen as carrier gas in a vertical furnace.

The thin film is formed by oxidation and nitriding of the silicon surface as follows.

(1) The vertical CVD furnace temperature is controlled within the range of 300° C. to 450° C., nitrogen is introduced into the furnace and a wafer is inserted into the furnace extracting oxygen from the furnace. During the wafer loading, as the furnace is opened to the atmosphere, oxygen in the atmosphere comes into the furnace. Then the introduction of nitrogen into the furnace is stopped.

(2) The vertical furnace is evacuated until its inner pressure attains about 0.13 Pa. It takes 5 to 45 minutes to attain this pressure according to different furnaces. Nitrogen is not introduced into the furnace during this evacuating, remaining oxygen not sufficiently evacuated reacts with silicon of the wafer to form a thermal oxidation film of 0.1 nm to 2 nm in thickness. This film thickness is determined by the silicon surface temperature, the oxygen concentration and the oxidation time. In this case, the silicon surface temperature is related to the furnace temperature, but not only this, the wafer temperature history can be modified by changing the loading speed of wafer into the furnace. As the heat conduction to the wafer is also dependent of the time for attaining a pressure of about 0.13 Pa in the furnace, the latter can change the wafer temperature history. The silicon surface oxygen concentration also can be adjusted by changing the wafer loading speed into the furnace, and the time for attaining a pressure of about 0.13 Pa in the furnace. If the wafer is inserted faster, the time for attaining a pressure of about 0.13 Pa in the furnace can be shortened. By reducing the time for attaining a pressure of about 0.13 Pa in the furnace, the oxygen concentration can be lowered from the concentration contained in the atmosphere to a concentration equal to or lower than 0.13 Pa within a short period of time in the wafer temperature history. The silicon surface oxidation time also can be adjusted by changing the wafer loading speed into the furnace, and the time for attaining a pressure of about 0.13 Pa in the furnace. Therefore, the thickness of this thermal oxidation film, can be controlled by the furnace temperature (wafer introduction temperature), the wafer loading speed into the furnace, and the time for attaining a pressure of about 0.13 Pa in the furnace (oxygen evacuation time).

As detailed experiences by the inventors have demonstrated the correlation between this thermal oxidation film thickness and the surface oxidation concentration, the surface oxygen concentration is measured in place of the film thickness. It is supposed that this correlation is derived from that fact that this surface oxygen concentration is measured by SIMS, and oxygen atoms up to the depth of this thermal oxidation film approximately are counted.

Figure 6:
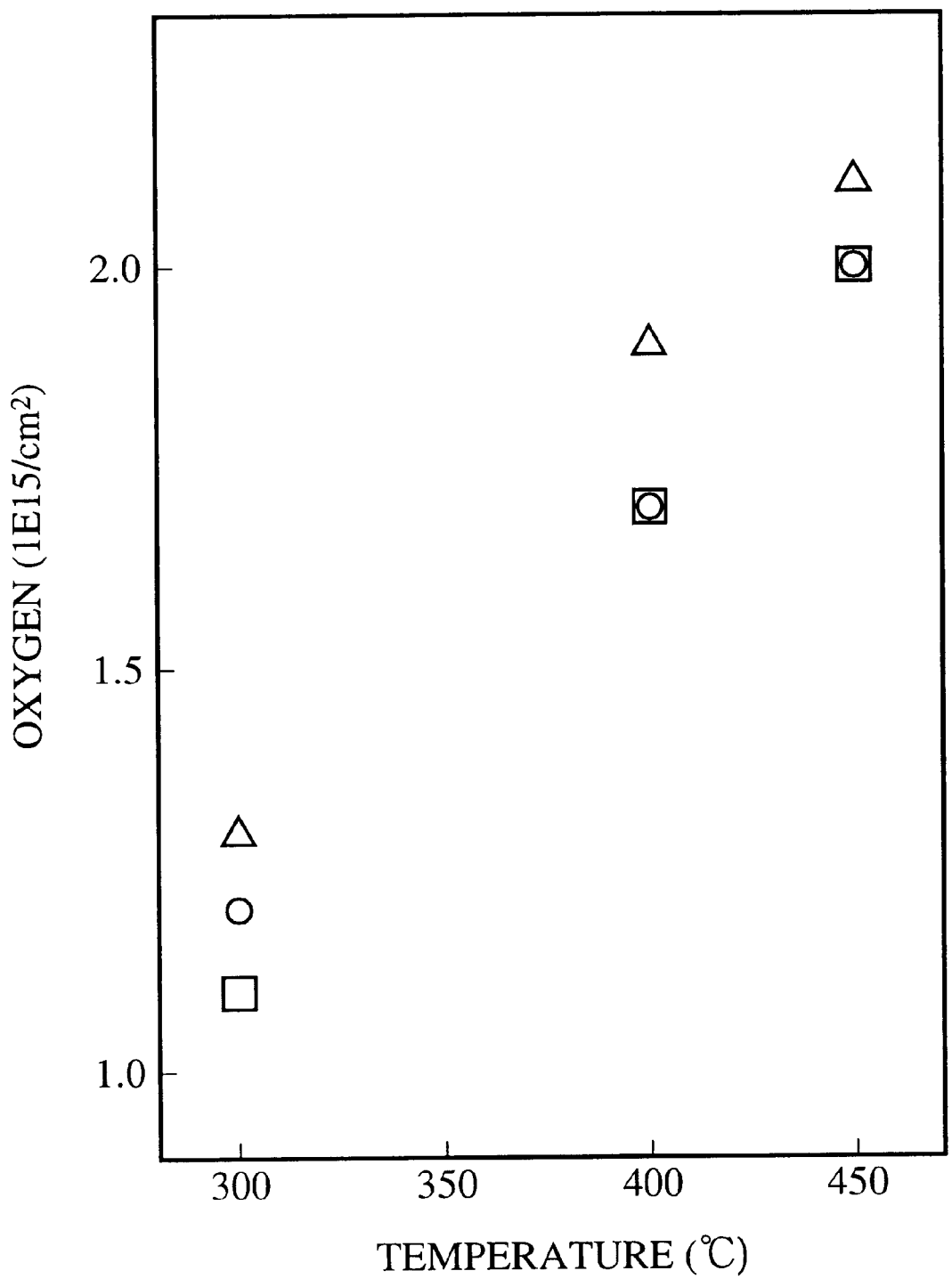
FIG. 6 is a graph showing the relation between the thermal oxide film wafer introduction temperature before the nitrification of a nitride oxide film and the surface oxide concentration of the thermal oxide film.

FIG. 6 is a graph showing the relation between the vertical type furnace temperatures and the surface oxide concentrations of the thermal oxide films. In the graph, Δ indicates the lower stage position of the wafer position in the vertical type furnace, □ indicates the middle stage position and ○ indicates the upper stage position.

This shows that the temperature elevation will increase the oxygen concentration. It tells also that it is advantageous to set the wafer introduction temperature within a range from 300° C. to 450° C., in order to obtain the desired film thickness of about 0.1 nm to 2 nm (desired surface oxygen concentration equal to or higher than $1 \times 10^{15}$ cm$^{-2}$ and equal to or lower than $2 \times 10^{15}$ cm$^{-2}$).

(3) Ammonia (NH$_3$) is introduced into a furnace which has attained the pressure, in order to nitrify the thermal oxidation film, after the oxygen evacuation time has elapsed, the temperature is elevated in the range from 600° C. to 800° C., in order to activate the reduction of oxide film and nitrogen, and the evacuating is performed within a pressure range from 133 Pa to 4000 Pa.

Figure 7:
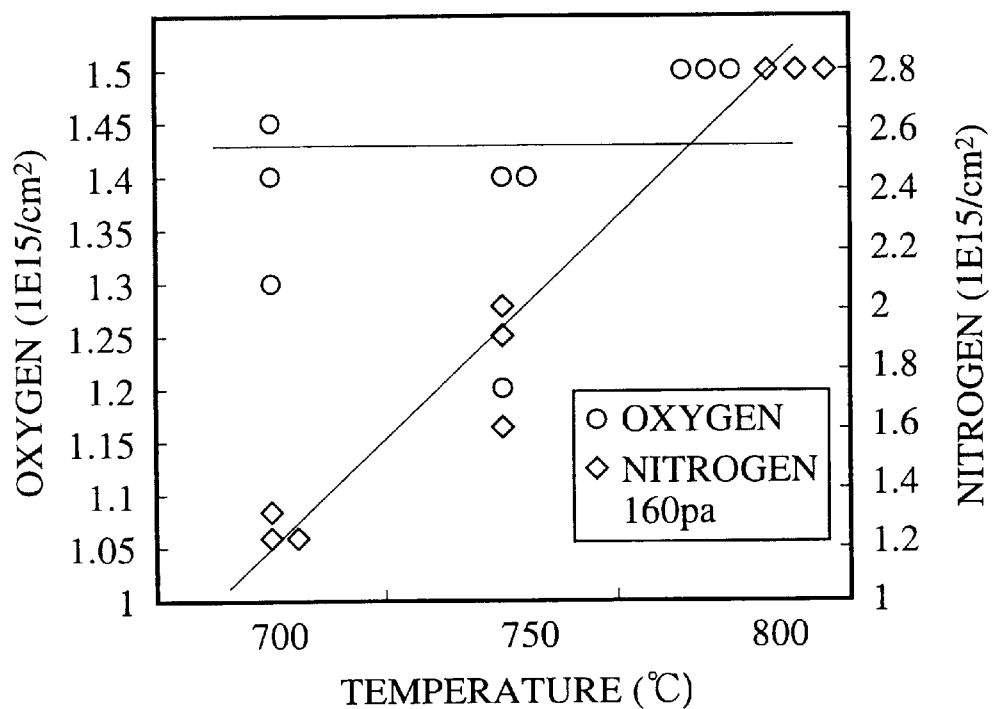
FIG. 7 is a graph showing the relation between the furnace temperature for the nitrification of a nitride oxide film, the surface oxide concentration of the nitride oxide film and the nitrogen concentration.

FIG. 7 is a graph showing the relation between the vertical furnace inner temperature during the nitrification, the surface oxide concentration of the nitride oxide film and the nitrogen concentration. In this graph, ◇ indicates the nitrogen concentration and ○ indicates the oxygen concentration. The furnace inner pressure has been kept constant at 160 Pa for 30 min. Nitrification and measurement are repeated 3 times at respective temperatures of 700° C., 750° C. and 800° C. The thermal oxide film nitrified at that time is formed at the furnace temperature of 400° C. This shows that higher it the temperature, higher also is the nitrogen concentration. On the other hand, the oxygen concentration is independent of the temperature elevation. Similarly, the nitrogen concentration can be elevated by increasing the furnace inner pressure or the time. The surface oxygen concentration and the nitrogen concentration are measured by SIMS. The nitrogen concentration elevation can lower the electron barrier of the thin film 41, and reduce the contact resistance than the thermal oxidation film. However, it is supposed that the nitrogen concentration also count nitrogen atoms up to the depth of about the film thickness, and as the nitrification can take place not only in the thermal oxide film, but also in the semiconductor region by nitrogen atoms that have passed through the thermal oxide film, even when the nitrogen concentration is elevated over a certain value, the thermal oxide film nitrification would not develop, but a nitride film is formed in the semiconductor region, constituting a resistance and, thus, increasing the contact resistance. Therefore, this suggests that an optimum surface nitrogen concentration does exists for reducing the contact resistance. As this nitrogen concentration is dependent of the oxide nitride film thickness, the surface oxygen concentration which decides the film thickness determines the nitrogen concentration. The detailed experiences by the inventors have shown that leakage current is not generated and the minimum contact resistance can be obtained when the surface oxygen concentration value is equal to or higher than $1 \times 10^{15}$ cm$^{-2}$ and equal to or lower than $2 \times 10^{15}$ cm$^{-2}$ and the surface nitrogen concentration is equal to or higher than $1 \times 10^{15}$ cm$^{-2}$ and equal to or lower than $4 \times 10^{15}$ cm$^{-2}$. Within said concentration range, the film thickness may exceed 2 nm, and event about 4 nm, leakage current is not generated, and the contact resistance remains about several dozens of ohm, providing enough applicability to the semiconductor devices. Time required for the nitrification differs from 5 min to 60 min according to the vertical type furnace to be used. Moreover, the conductor 46 may be embedded, all the way remaining in the same vertical furnace.

Next, the thin film 41 is formed on the silicon surface by oxidation as follows.

(1) The vertical CVD furnace temperature (wafer introduction temperature) is controlled within the range of 400° C. to 550° C., nitrogen is introduced into the furnace and a wafer is inserted into the furnace extracting oxygen from the furnace. During the wafer loading, as the furnace is opened to the atmosphere, oxygen in the atmosphere comes into the furnace. The wafer introduction temperature is higher than that for the oxide nitride film formation, in order to increase the film formation speed. Then the introduction of nitrogen into the furnace is stopped.

(2) The vertical furnace is evacuated until its inner pressure attains the range of 20 kPa to 30 kPa. It takes 5 to 60 minutes (oxygen evacuation time) to attain this pressure according to different furnaces. Nitrogen is not introduced into the furnace during this evacuating, remaining oxygen not sufficiently evacuated reacts with silicon of the wafer to form a thermal oxidation film of 0.1 nm to 2 nm in thickness. As for the thermal oxide film formation prior to the formation of nitride oxide film, the film thickness and the surface oxygen concentration can be controlled by the furnace temperature (wafer introduction temperature), the loading speed of wafer into the furnace and the time for attaining a pressure of about 20 kPa to 30 kPa in the furnace. The objective pressure is higher than that for the thermal oxide film formation prior to the formation of nitride oxide film formation, in order to increase the film formation speed.

Figure 8:
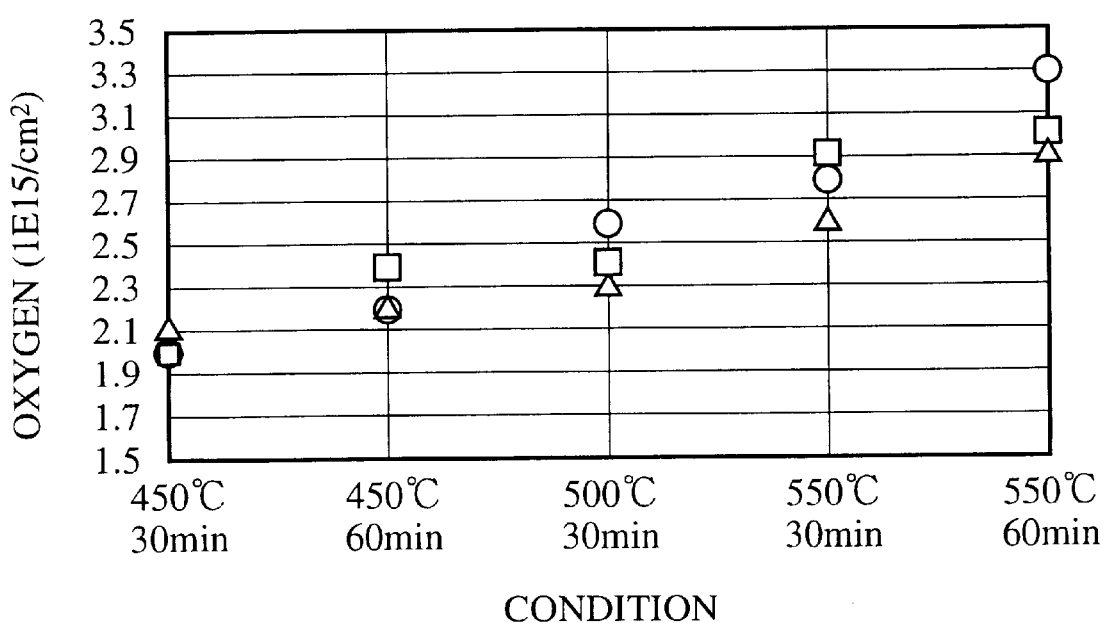
FIG. 8 is a graph showing the relation between the film formation conditions the thermal oxide film and the surface oxide concentration of the thermal oxide film.

FIG. 8 is a graph showing the relation between the vertical furnace temperature, the oxygen evacuation time and the surface oxide concentration of the thermal oxide film. Symbols in the drawing are same as for FIG. 6. This tells that higher is the temperature or longer the oxygen evacuation time, higher is the surface oxygen concentration. To obtain the desired film thickness of about 0.1 nm to 2 nm (equal to or higher than $1 \times 10^{15}$ cm$^{-2}$ and equal to or lower than $4 \times 10^{15}$ cm$^{-2}$), it is enough to set the wafer introduction temperature in the range from 450° C. to 550° C., and the oxygen evacuation time in the range from 30 minutes to 60 minutes.

Moreover, after the oxygen evacuation time has elapsed, the furnace can be evacuated to attain about 0.13 Pa and a conductor 56 can be embedded all the way remaining in the same vertical furnace.

If it is necessary to control precisely the thickness of the thin film 41, molecular layer epitaxy (MLE) method can be used. In other words, at the state where it is exhausted from $10^{-7}$ Pa to $10^{-8}$ Pa, a gas of compound containing monosilane (SiH$_4$), disilane (Si$_2$H$_6$), dichlorosilane (SiH$_2$Cl$_2$) or silicon compound such as organic silicon is introduced 5 to 20 seconds into the upper portion of the trench under a pressure of $10^{-1}$ Pa to $10^{-3}$ Pa, then evacuated. Next, oxygen (O$_2$) is introduced 5 to 30 seconds under a pressure of $10^{-1}$ Pa to $10^{-3}$ Pa, then evacuated. By repeating this introduction/evacuation/introduction/evacuation cycle, an oxide film of one molecular layer can be formed by this one cycle. Using surface absorption phenomenon, the film formation stops automatically with one molecular layer thickness, without any film thickness monitor.

The similar method, using molecular beam epitaxy (MBE) process, is also possible. Namely, it is possible to use atomic layer epitaxy (ALE) process, but by the ALE process, the step coverage is low, because it is based on the vacuum evaporation.

Figure 5C:
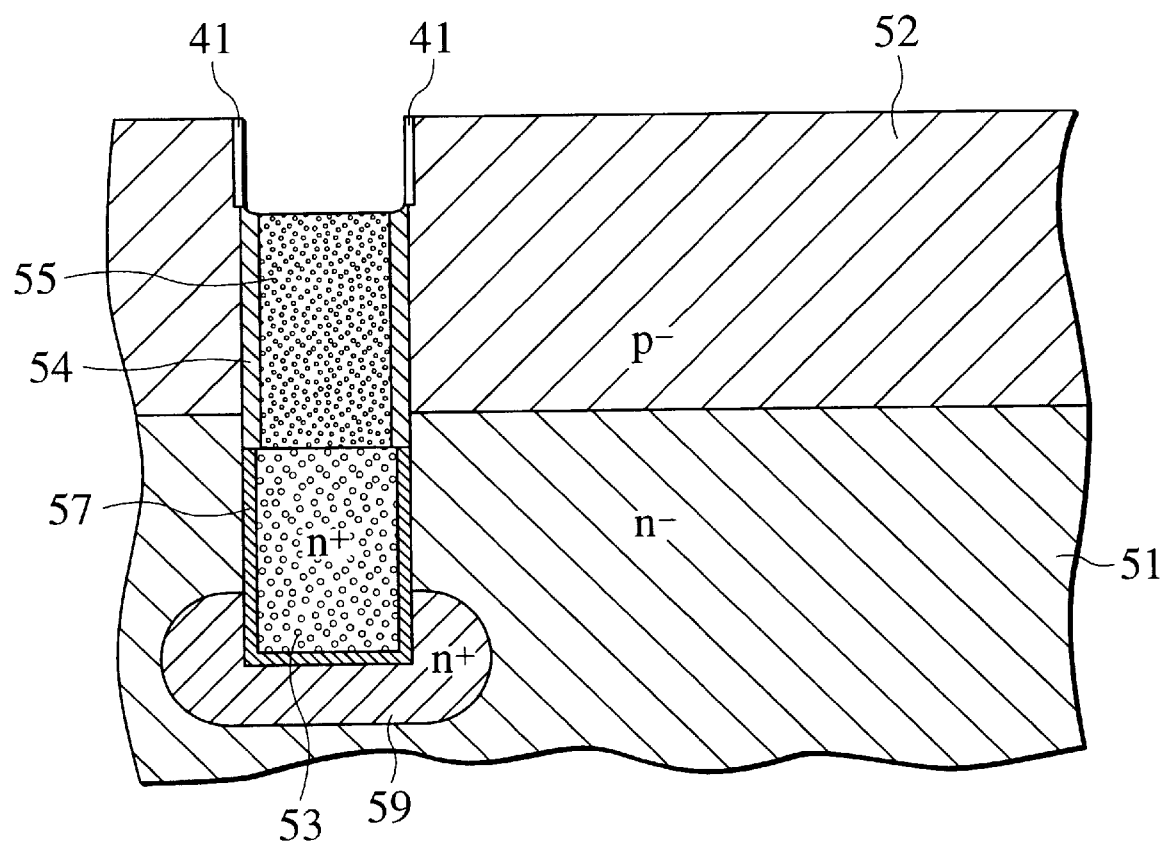

Thereafter, as shown in FIG. 5C, using highly directive RIE, only the thin film 41 on the upper portion of the second n+ doped poly silicon 55 is removed selectively. However, this process in not indispensable. If the thin film 41 is not thick, it may be left on the upper portion of the second n+ doped poly silicon 55.

Figure 5D:
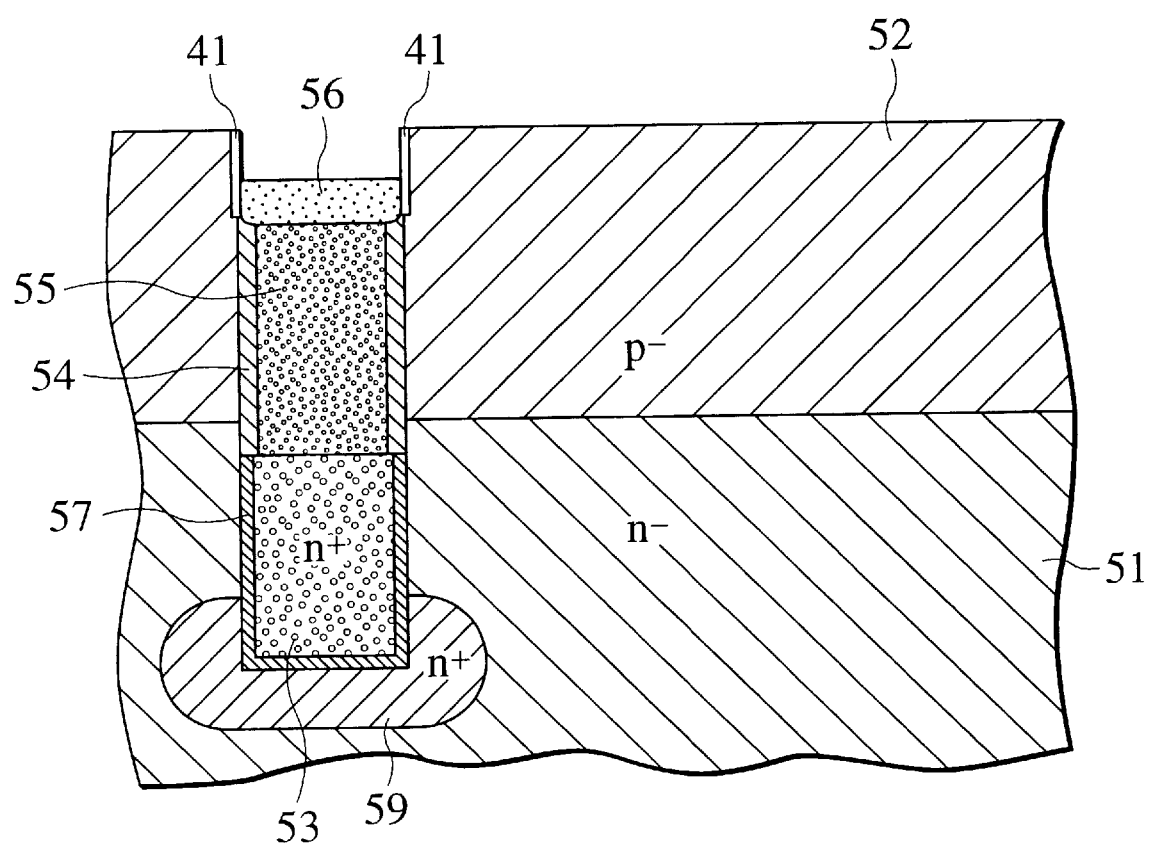

(c) Then, as shown in FIG. 5D, a conductor 56 is embedded. The embedding temperature of the conductor 56 is 500° C. to 600° C., and the conductor 56 may be formed with amorphous silicon (a-Si) or doped poly silicon under the reduced CVD using disilane as raw material gas. Thereafter, STI region 2 is etched back by the required depth as shown in FIG. 5D.

Figure 5E:
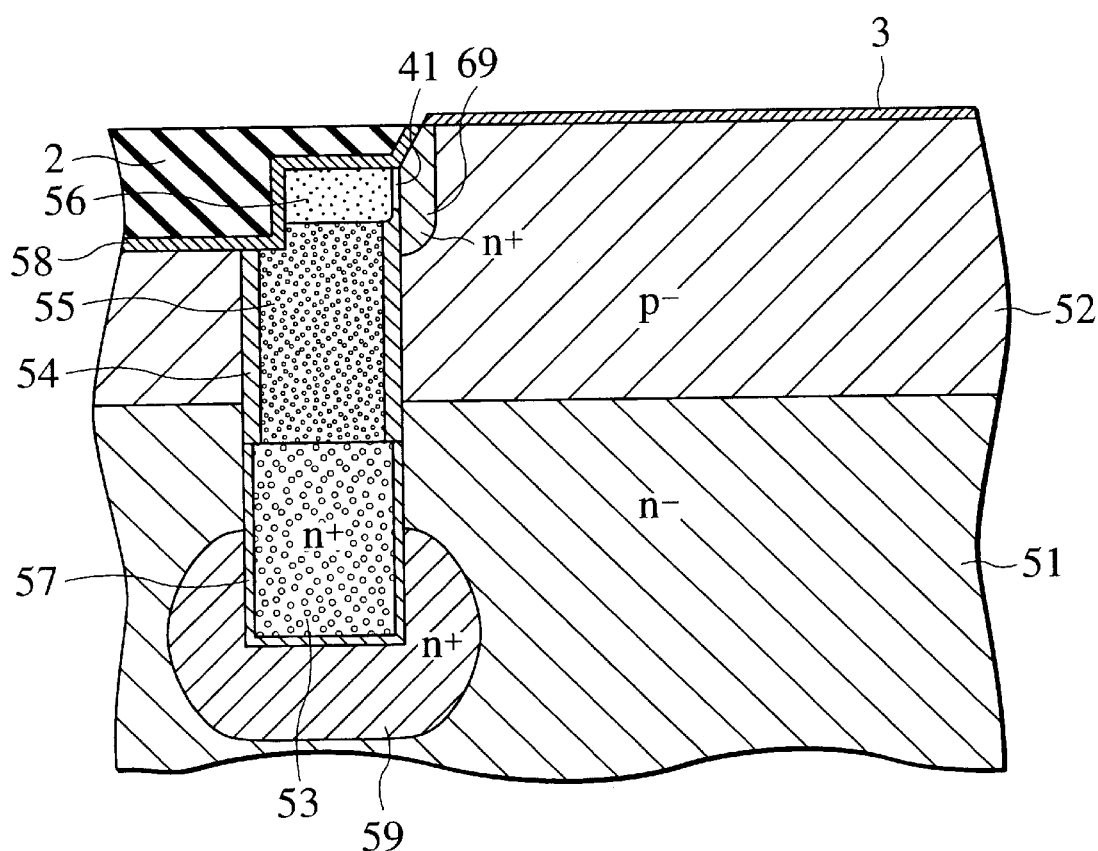

(d) Moreover, using photolithography and RIE process, p⁻ layer 52 around the active region is removed by etching. On the other hand, the excessive conductor 56 in the trench upper portion is also removed. A silicon nitride film ($Si_3N_4$) 58 is formed in thus formed shallow trench, then an insulation layer 2 of silicon oxide film ($SiO_2$) or the like is embedded, to form a STI region as shown in FIG. 5E.

Figure 5F:
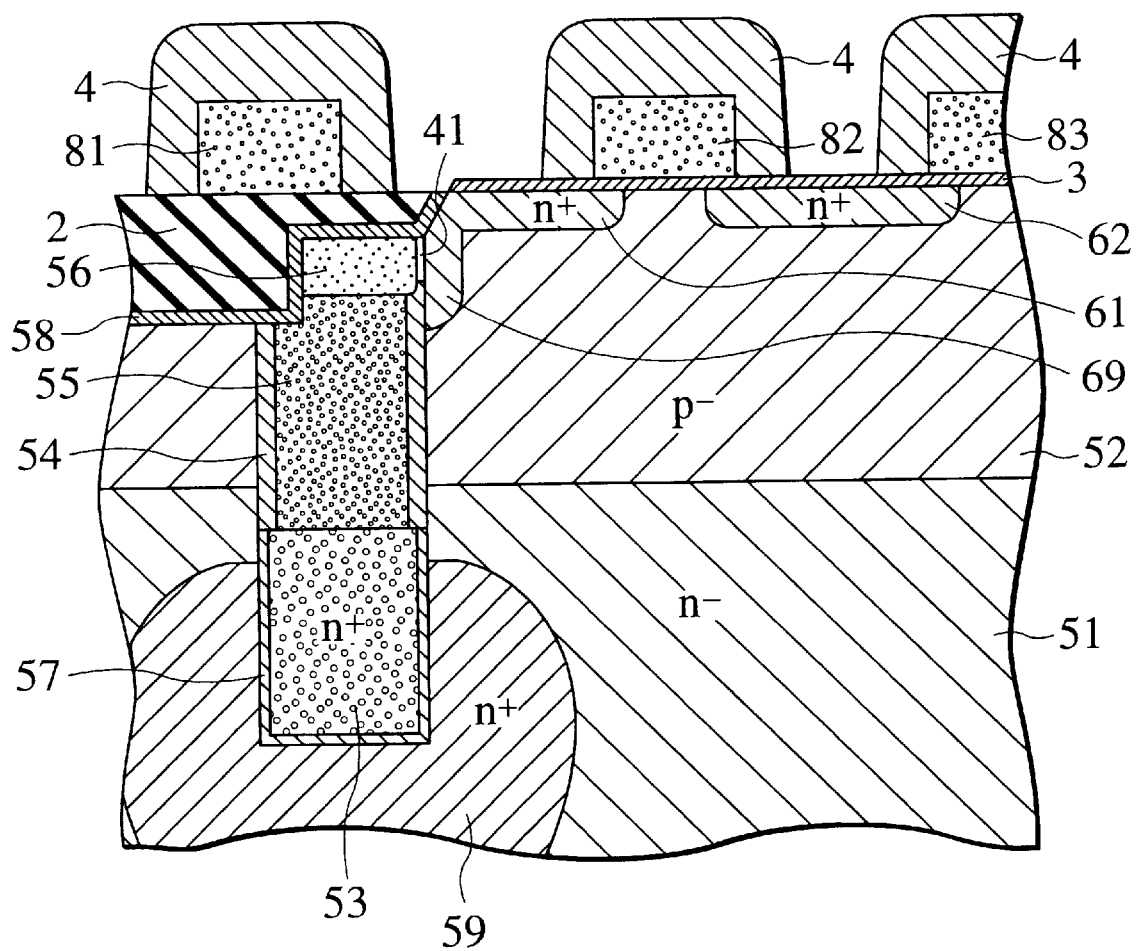

(e) Next, a gate insulation film 3, phosphor doped n+ doped poly silicon 81, 82, 83 of 100 to 300 nm in thickness and a silicon nitride film ($Si_3N_4$) 4 of 150 to 250 nm in thickness are piled up, the silicon nitride film ($Si_3N_4$) 4 and the n+ doped poly silicon 81, 82, 83 are dry etched using photoresist film as mask, to form gate electrodes 81, 82, 83 as shown in FIG. 5F. Next, for example, phosphor ($^{31}P^+$) is ion implanted using the gate electrodes 81, 82, 83 as photoresist film.

(f) After ion implantation, n+ source region 61 and n+ drain region 62 of nMOSFET are formed by executing the predetermined thermal process. It is similar to the well-known manufacturing process of MOSFET. Note that other structure than shown in FIG. 5F or many similar methods can be adopted. For example, the ion implantation can be executed twice to dispose a LDD structure MOSFET. Next, silicon nitride film ($Si_3N_4$) 4 of 150 to 250 nm in thickness is piled up, the silicon nitride film ($Si_3N_4$) 4 is etched back to form a side wall 4 for the gates electrodes 81, 82, 83 as shown in FIG. 5F.

Figure 5G:
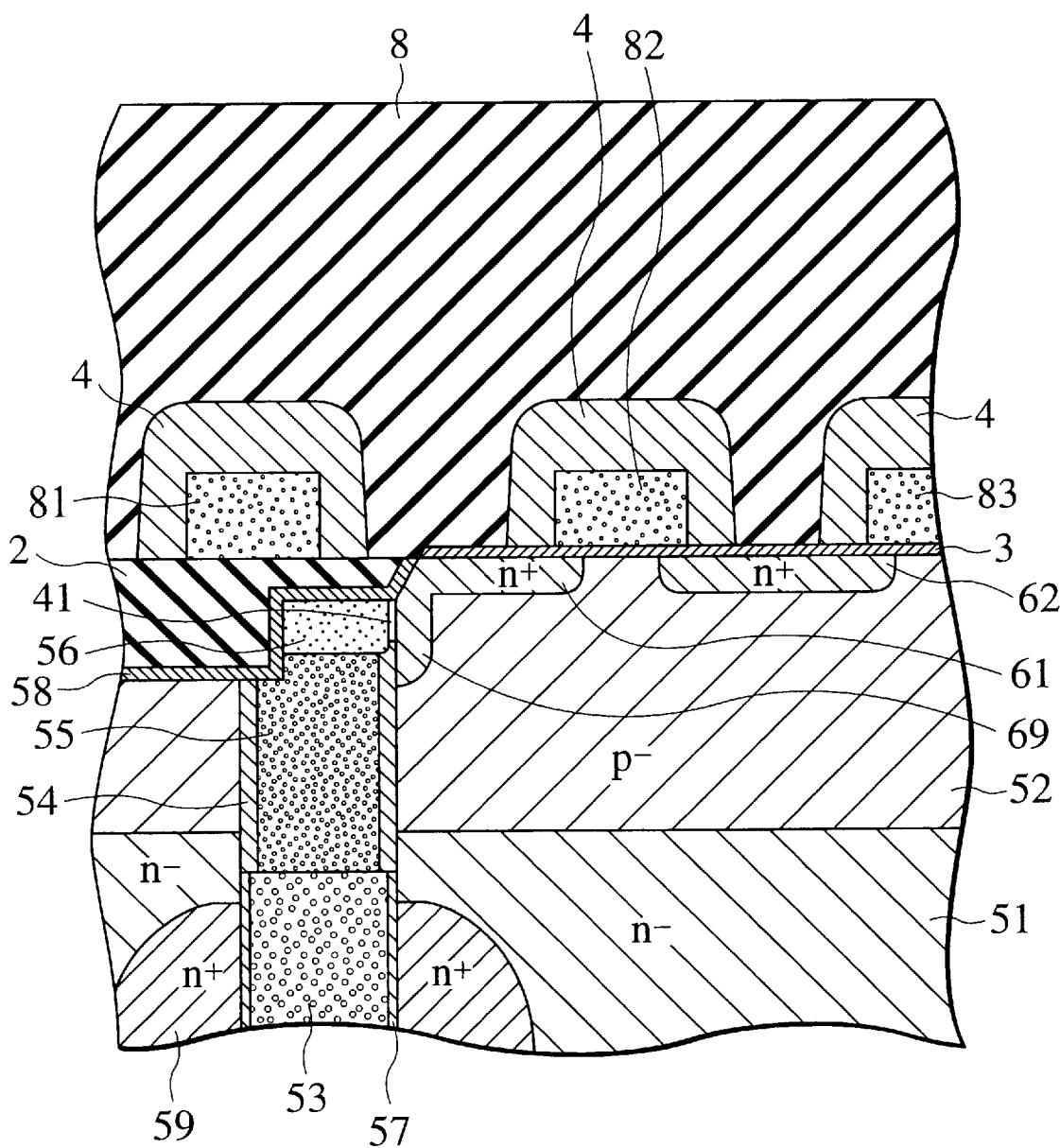

(g) Next, as shown in FIG. 5G, interlayer insulation films such as BPSG or the like are piled up. Thereafter, the interlayer insulation film 8 is leveled to the predetermined thickness, for example 400 to 600 nm, by reflowing. Then, the photoresist film is spin coated over the interlayer insulation film 8, and this photoresist film is patterned by photolithography. Using this resist pattern as mask, contact holes are perforated by RIE. The contact hole diameter is advantageously 0.15 to 0.5 μm. Thereafter, the photoresist film will be removed.

(h) Next, as shown in FIG. 3, a contact plug 12 is formed by embedding n+ doped poly silicon in the contact hole. At last, a barrier metal 11 is formed, and a wiring (bit line) will be composed thereon.

Here, if the presence of the thin film is likely to inhibit the diffusion of n type dopant from the conductor 56, it is preferable to implant phosphor ($^{31}P^+$) or arsenic ($^{75}As^+$) into the portion where the n+ buried contact 69 is to be formed, in the upper portion of the trench, obliquely upward from the substrate, before embedding the conductor 56 in the step (c). It is also effective to perform CVD of n type high concentration doped poly silicon or doped amorphous silicon (a-Si) in place of executing CVD of non doped poly silicon or amorphous silicon in said step (c).

(Second Embodiment)

Figure 9:
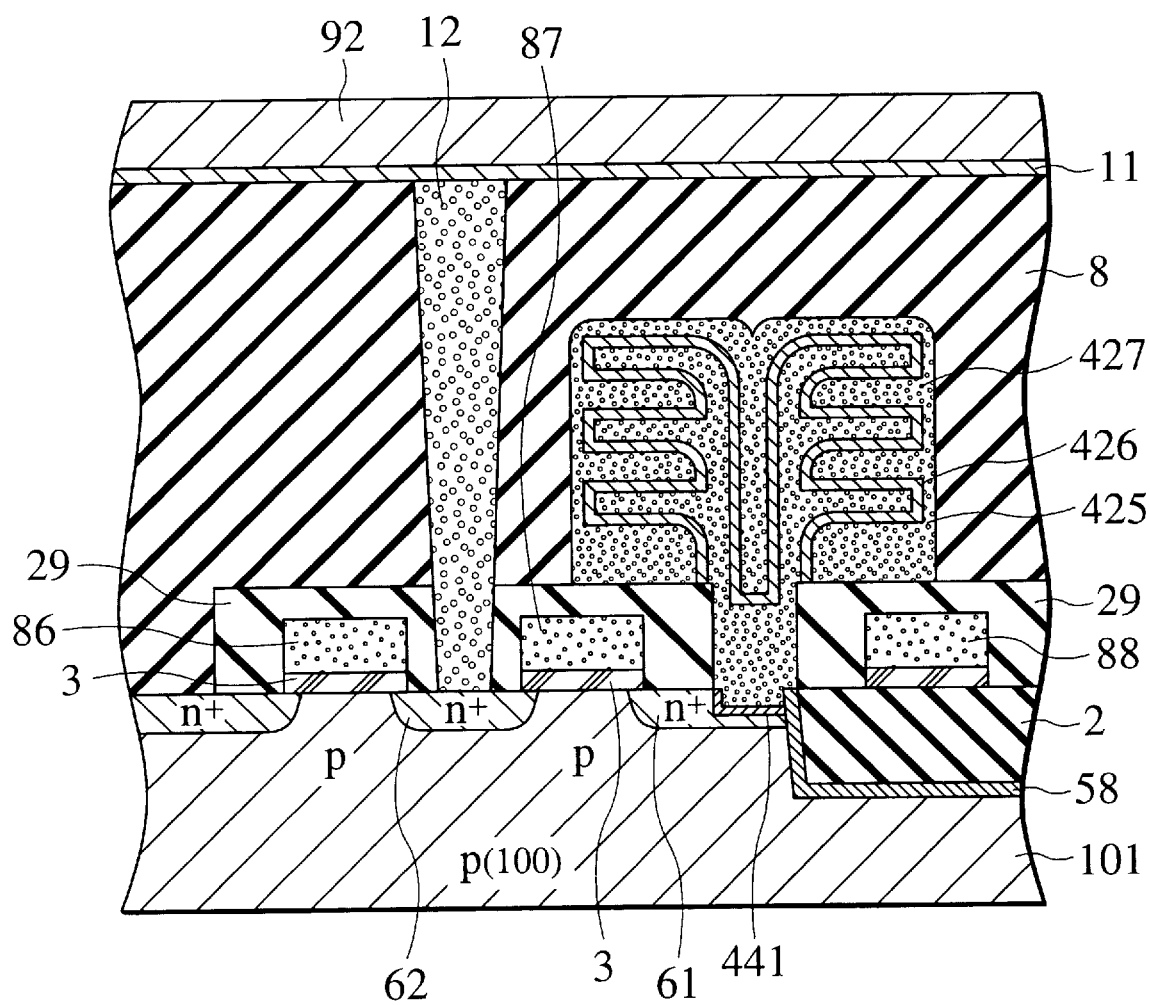
FIG. 9 is a cross section of a DRAM according to a second embodiment of the present invention.

In the first embodiment, a trench type DRAM has been described, however, it is nothing but an illustrative example, and obviously, it can also be applied to stack type DRAM, fin type DRAM, or various other DRAMs. FIG. 9 is a schematic cross-section of a fin type DRAM according to the second embodiment of the present invention. In FIG. 9, there is an active region surrounded by an isolation region 2 formed by STI process or the like on the surface of a p type (100) silicon substrate 101. An n+ source region 61 and an n+ drain region 62 of an access transistor are disposed on this active region. The region between the n+ source region 61 and the n+ drain region 62 of the access transistor constitutes the channel region. Gate electrodes 86, 87, 88 of poly silicon or the like are formed on the upper portion of this channel region via a gate oxide film 3. The poly silicon electrodes 86, 87, 88 serve also as word lines, and extend in a direction orthogonal to a bit line 92. A silicon nitride film ($Si_3N_4$) 29 is formed on the electrodes 86, 87, 88 and the side wall. And, a interlayer insulation film 8 such as BPSG and SiO2 is formed on the silicon nitride film ($Si_3N_4$) 29. A bit line 92 is disposed on the interlayer insulation film 8. Moreover, a contact plug 12 is disposed in the upper portion of the n+ drain region 62. Further, the contact plug 12 is connected to the bit line 92.

The charge storage capacitor section (capacitor section) is composed of a storage electrode 425, a capacitance insulation film 426 and a plate electrode 427. As capacitance insulation film 426, not only silicon oxide film ($SiO_2$), but also silicon nitride film ($Si_3N_4$), tantalum oxide film ($Ta_2O_3$), strontium titanate ($SrTiO_3$), barium titanate ($BaTiO_3$) or other various conductors can be used. On the other hand, lead zirconate titanate (PZT), barium strontium titanate ($Ba_xSr_{1-x}TiO_3$) or other ferroelectric films used as capacitance insulation film 426 act as ferroelectric RAM (FRAM).

A pn junction is formed with the p type (100) silicon substrate 101 and the n+ source region 61 of the access transistor disposed in a part thereof. A pit is formed in a part of the surface of the n+ source region 61 in order to reduce the contact resistance or for other purposes, and a part of a conductor, that is the storage electrode 425 of the charge storage capacitor section is embedded in the pit. The storage electrode (conductor) 425 and the n+ source region 61 are connected via a thin film 441. This thin film 441 has a crystal structure different from the n+ source region 61 and, for example, oxide film ($SiO_2$), nitride film ($Si_3N_4$) or silicon nitric oxide film (SiON) or the like can be used.

The presence of the thin film 441 prevents the epitaxial growth from starting from the interface between the n+ source region 61 and the conductor 425. Consequently, the crystal defect formation caused by this epitaxial growth is restressed and the leakage current generation near the n+ source region 61 can be inhibited. This allows to ensure a good operation of the fin type DRAM.

Next, this connection section can be manufactured by the following process.

First, up to gate electrodes 86, 87, 88 are formed by a process similar to the conventional nMOS transistor.

Figure 10A:
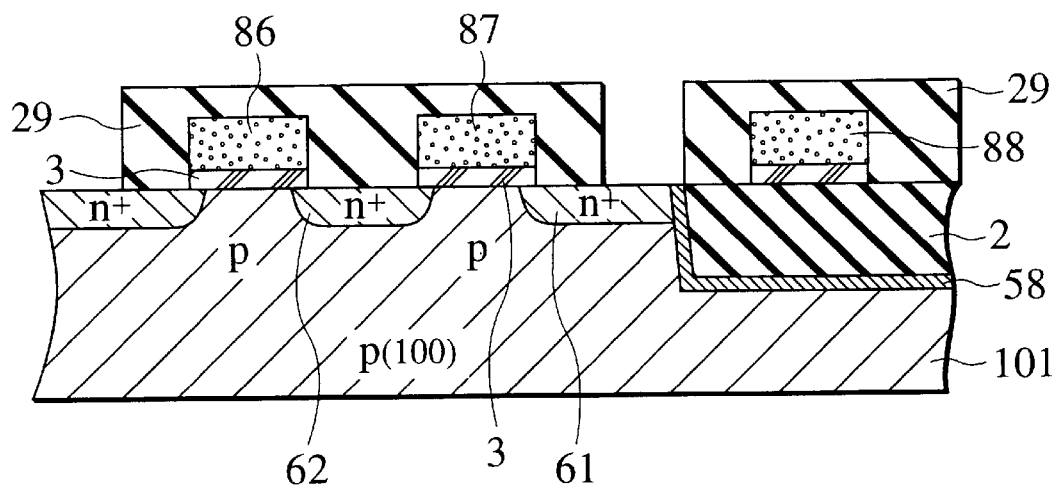
FIGS. 10A to 10D are cross sections concerning process diagrams illustrating a manufacturing method of a DRAM according to a second embodiment of the present invention.
Figure 10B:
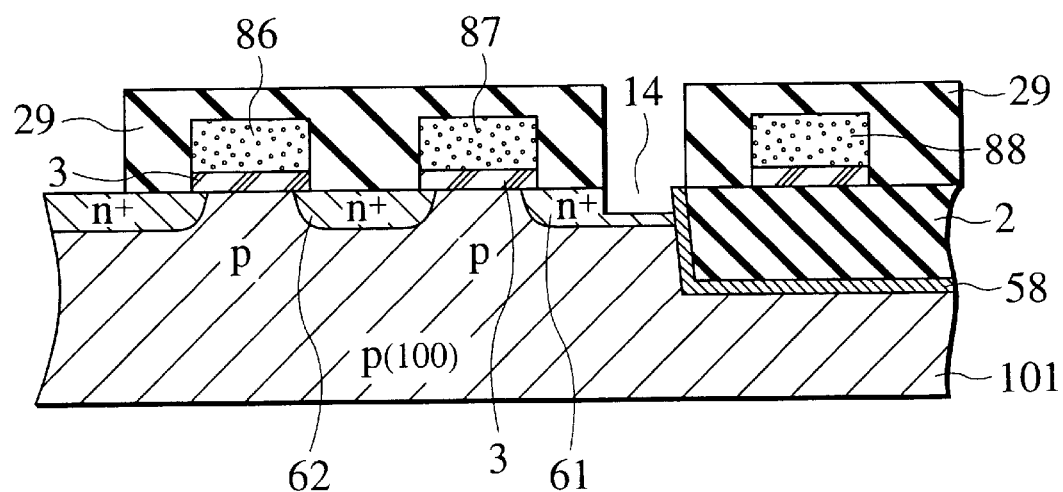
Figure 10C:
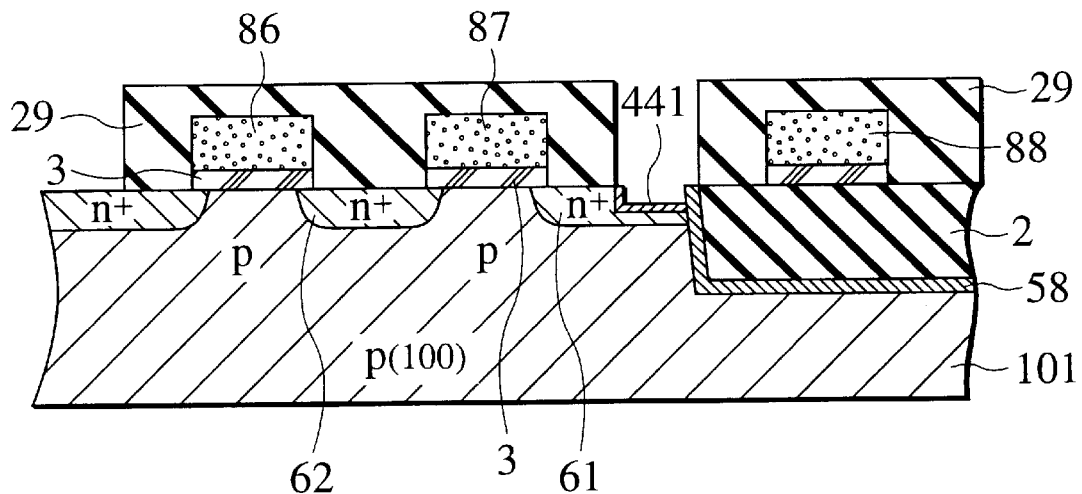
Figure 10D:
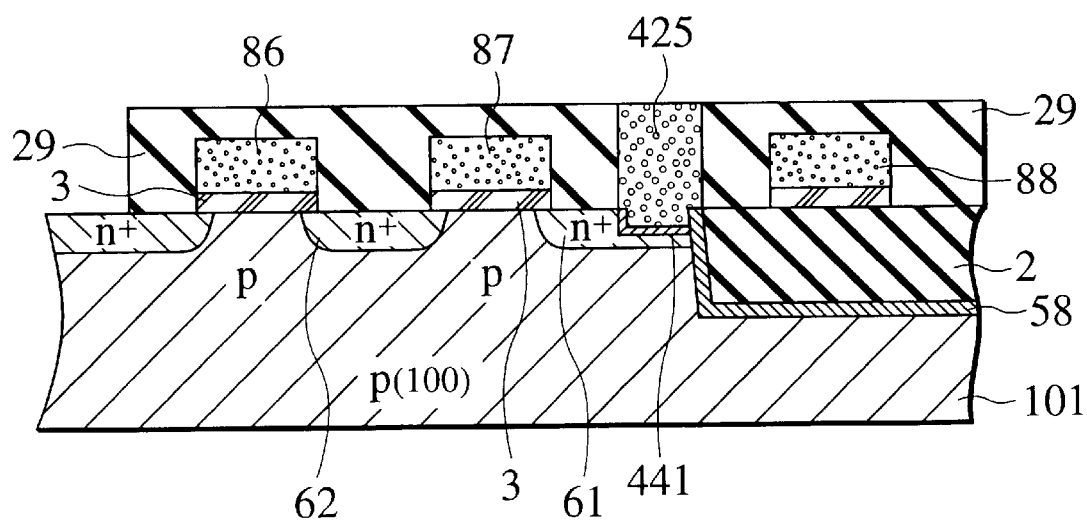

Next, as shown in FIG. 10A, a silicon nitride film is piled up, and a silicon nitride side wall 29 is formed by etching back. Next, as shown in FIG. 10B, a photoresist film is formed except for the region where a connection section between the storage electrode 425 and the n⁺ source region 61 is to be formed by photolithography, and a trench 14 for buried contact formation of 0.1 to 0.5 μm in depth is formed by ECR ion etching or RIE with $CF_4$, $SF_6$, $CBrF_3$, $SiCl_4$ or $CCl_4$ or the like, using the silicon nitride film as a mask. Thereafter, as shown in FIG. 10C, a thin film 441 of 0.1 nm to 2 nm in thickness is formed in the trench upper portion. The thin film 441 is formed in a vertical furnace by the silicon surface oxidation using oxygen and nitrogen as carrier gas, or by silicon surface oxidation nitriding using oxygen and ammonia ($NH_3$) and nitrogen as carrier gas. Or, a film formation method similar to the first embodiment can be applied. Next, as shown in FIG. 10D, a conductor is embedded. For embedding the conductor 425, amorphous silicon (a-Si) or poly silicon is formed into a film by the reduced pressure CVD using disilane or monosilane as raw material gas under a temperature of 500° C. to 800° C.

Then, in order to form the storage electrode (conductor) 425, the capacitance insulation film 426 and the plate electrode 427 of a fin type charge storage capacitor section (capacitor section), a predetermined number of fins are formed one by one. A high temperature heat treatment process such as CVD is required respectively for the formation of each fin layer. When a fin structure is thus formed, an interlayer insulation film 8 is formed by CVD process, a contact hole is delineated, and a contact plug is formed in this contact hole. Finally, a bit line 92 is formed coming into contact with the contact plug to complete the DRAM of FIG. 9. Thus, high temperature heat treatment process is repeated for a number of times for the fin type DRAM. Therefore, the presence of the thin film 441 is extremely effective to prevent the epitaxial growth from developing from the interface between the n⁺ source region 61 and the storage electrode 425.

(Third Embodiment)

Figure 11:
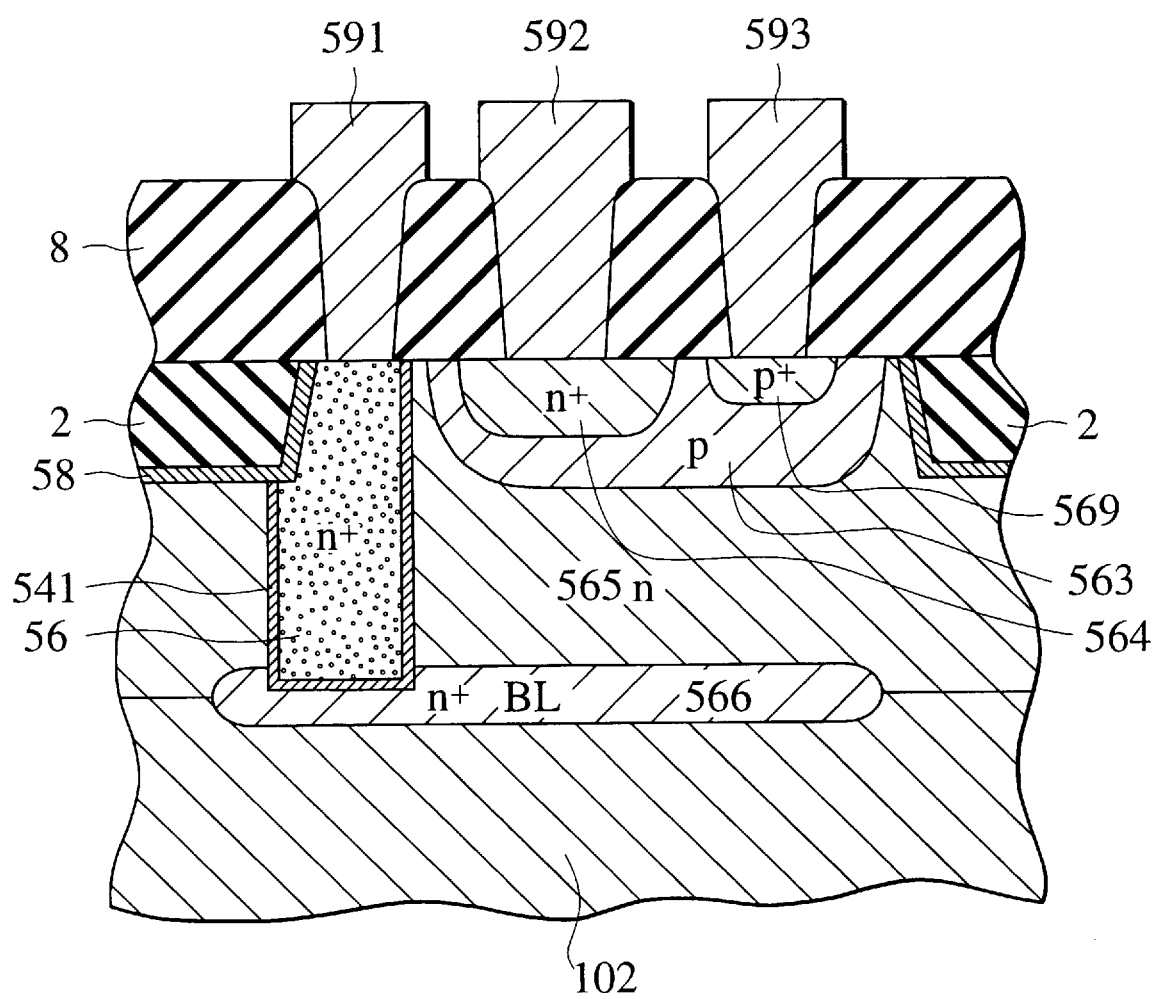
FIG. 11 is a cross section concerning a semiconductor device (bipolar transistor) according to a third embodiment of the present invention.

The present invention is not limited to the memory device shown in the first or second embodiments. Nor, it is not limited to the MOS integrated circuit shown in the first or second embodiments. FIG. 11 is a cross section of a bipolar integrated circuit as a third embodiment of the present invention. This bipolar integrated circuit illustrates a part of TTL logic circuit as an example. In FIG. 11, an n⁺ buried layer 566 (buried collector region) is formed on a p type (100) silicon substrate 102, and an n well region (collector) 565 is formed on that n⁺ buried collector region 566. A p base region 563 and an n⁺ emitter region 564 are formed on the collector region 565. A p⁺ base contact region 569 is formed on a part of the surface of the p base region 563. On the other hand, an isolation region 2 is formed by STI process or the like on the n collector region 565. An interlayer insulation film 8 is formed on the n collector region 565, the p⁺ base region 563, the n⁺ emitter region 564 and the isolation region 2. A base electrode 593 and an emitter electrode 592 are formed on the p⁺ base contact region 569 and n⁺ emitter region 564. The n⁺ buried collector region 566 is connected to the collector electrode 591 via a conductor 56 (buried electrode).

An pn junction is formed by the p type (100) silicon substrate and the n⁺ buried collector region 566 provided in a part thereof. A pit if formed on a part of the surface of the n⁺ buried collector region 566 in order to draw the electrode to the semiconductor surface, and a conductor composed of n⁺ doped amorphous silicon or n⁺ doped poly silicon constituting a collector buried electrode 56 is embedded totally in this pit. A thin film 541 having a crystal structure different from that of the conductor, n⁺ buried collector region 566 or n collector region 565 is formed at the interface between the collector buried electrode (conductor) 56 and the n⁺ buried collector region 566.

As the thin film 541, oxide film ($SiO_2$), nitride film ($Si_3N_4$), silicon nitric oxide film (SiON) or the like can be used. As the thin film 541 is formed at the interface between the collector buried electrode 56 and the n⁺ buried collector region 566 and at the interface between the collector buried electrode 56 and the n⁺ buried collector region 565, the epitaxial growth of n⁺ doped amorphous silicon or n⁺ doped poly silicon is prevented from starting from this interface. Consequently, the crystal defect formation caused by this epitaxial growth is inhibited. As the result, the leakage current generation near the collector buried electrode 56 can be inhibited.

Next, this connection section can be manufactured by the following process.

Figure 12A:
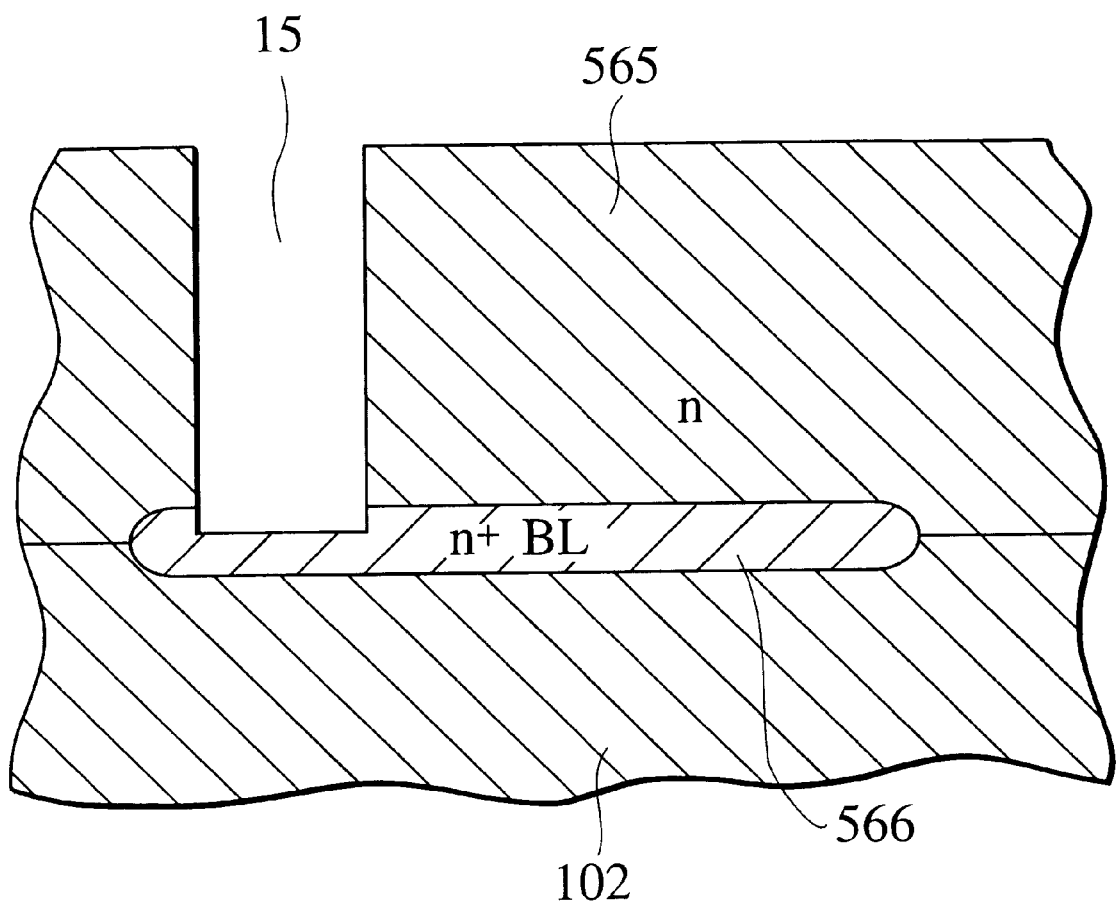
FIGS. 12A to 12C are cross sections concerning process diagrams illustrating a manufacturing method of a semiconductor device (bipolar transistor) according to a second embodiment of the present invention.
Figure 12B:
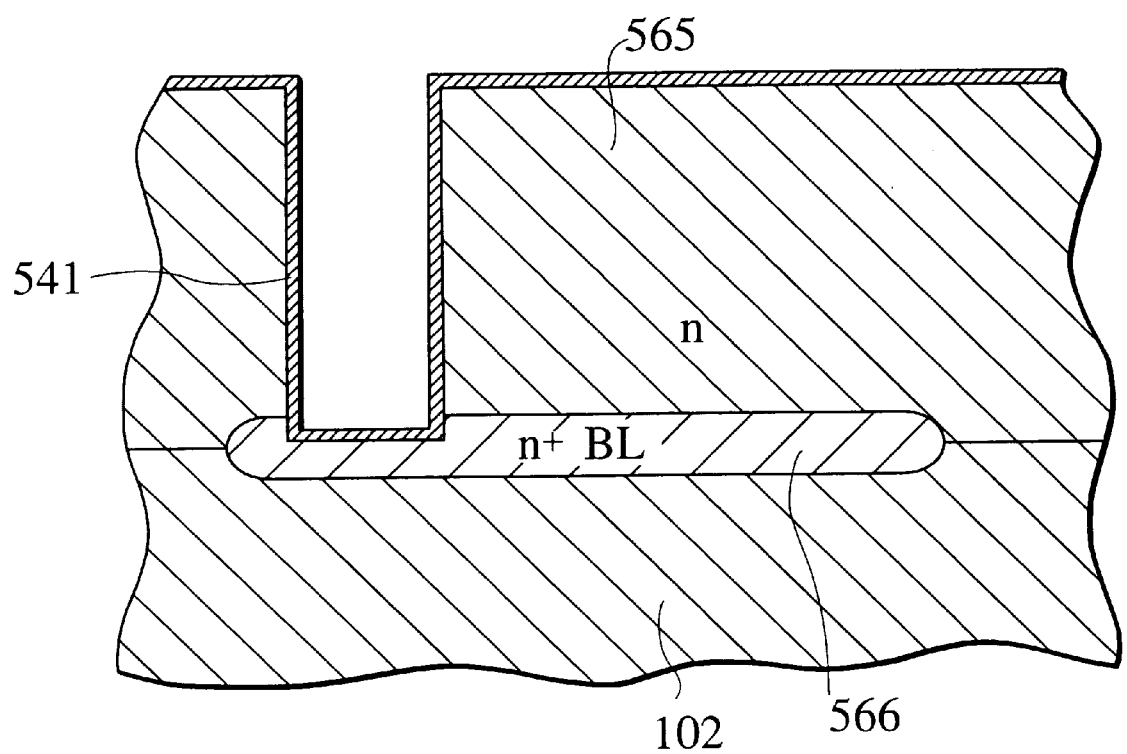
Figure 12C:
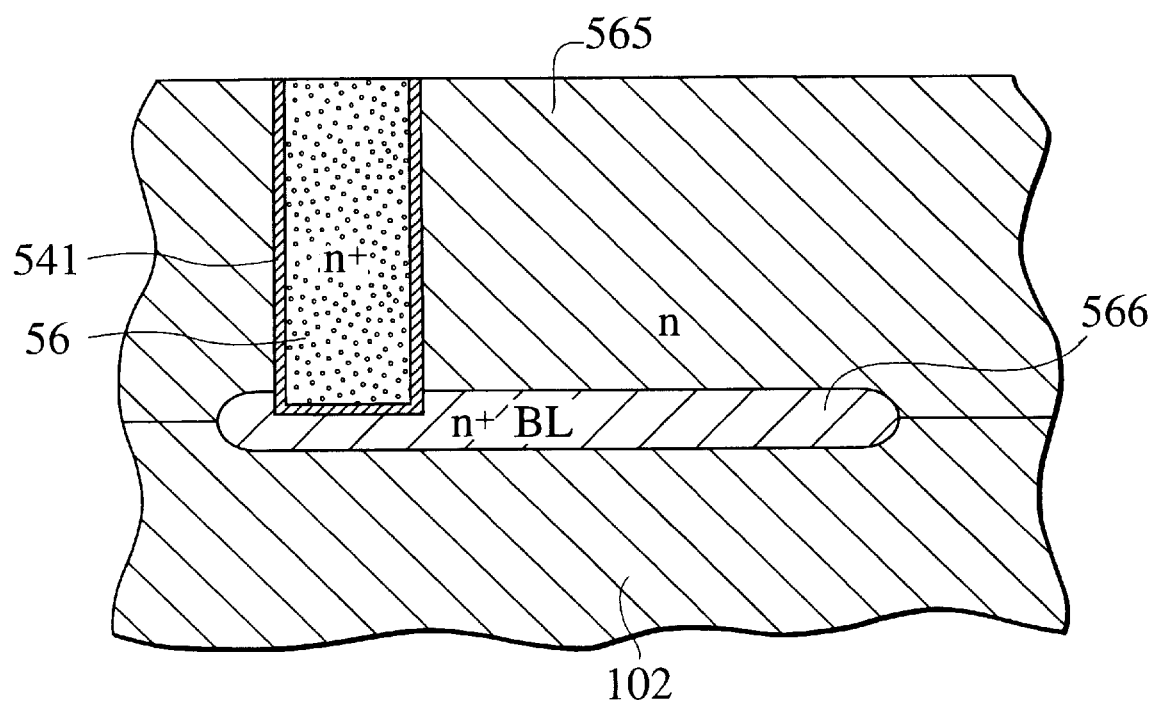

First, the n⁺ buried collector region 566 and the n collector region 565 are formed by a process similar to the conventional npn bipolar transistor. Next, as shown in FIG. 12A, a photo resist is formed, except for the region where the collector drawing electrode 56 is to be formed, by photolithography, and a trench 15 for drawing electrode formation of 0.5 to 2 μm in depth is formed by ECR ion etching or RIE with $CF_4$, $SF_6$, $CBrF_3$, $SiCl_4$ or $CCl_4$ or the like. Thereafter, as shown in FIG. 12B, a thin film 541 of 0.1 nm to 2 nm in thickness is formed in the trench 15 inner wall. The thin film 541 is formed in a vertical furnace by the silicon surface oxidation using oxygen and nitrogen as carrier gas, or by silicon surface oxidation and nitriding using oxygen and ammonia ($NH_3$) and nitrogen as carrier gas. Or, a film formation method similar to the first embodiment can be applied. Next, as shown in FIG. 12C, the film of conductor 56 is formed and embedded by etching back. For film formation of the conductor 56, amorphous silicon (a-Si) or poly silicon is formed into a film by the reduced pressure CVD using disilane or monosilane as raw material gas under a temperature of 500° C. to 800° C. At this time, n⁺ doped amorphous silicon or n⁺ doped poly silicon can be piled up by using arsine ($AsH_3$) or phosphine ($PH_3$) as a doping gas.

Thereafter, as shown in FIG. 11, STI region 2 is formed by using RIE and CVD. Then boron ($^{11}B^+$) is ion implanted to form the p base region 563, and annealed. Moreover, arsenic ($^{75}As^+$) is ion implanted to form the n⁺ emitter region 564, and boron ($^{11}B^+$) or $^{49}BF_2^+$ to form the p⁺ base contact region 569, and then heat treated. Further, an interlayer insulation film 8 of $SiO_2$, PSG, BPSG or the like is formed by CVD process. Then, a contact hole is perforated in this interlayer insulation film 8, and respective collector electrode 591, emitter electrode 592 and base electrode 593 are formed.

Thus, a number of high temperature heat treatment process is repeated after the formation of the collector buried electrode 56, but, the presence of the thin film 541 prevents the epitaxial growth from developing from the interface between the collector buried electrode 56 and the n⁺ buried collector region 566 and at the interface between the collector buried electrode 56 and the n⁺ buried collector region 565.

As mentioned before, the present invention has been described by the first to third embodiments, but it should not be understood that the specifications and drawings constituting a part of this disclosure define the present invention. Various alternative embodiments, examples and operation techniques will become obvious for those skilled in the art from this teaching.

The present invention is not limited to the integrated circuit mentioned in the first to third embodiments, but it can also be applied, for example, to the electrode sections or others of an isolated power device or transistor for high frequency. Though silicon has represented the typical semiconductor material, it is evident that it can also be applied to the compound semiconductor, such as gallium arsenide (GaAs).

Various modifications will become possible for those skilled in the art after receiving the teaching of the present disclosure without departing from the scope thereof.

What is claimed is:

1. A semiconductor device comprising:
   (a) a first semiconductor region of a first conductivity type;
   (b) a second semiconductor region of a second conductivity type joined with an upper side of said first semiconductor region;
   (c) a third semiconductor region of the second conductivity type joined with a lower side of said first semiconductor region;
   (d) a conductor region embedded in said first and third semiconductor regions and being adjacent to said second semiconductor region;
   (e) a thin film disposed at an interface between said conductor region and said second semiconductor region and having a crystal structure different from those of said conductor region and said second semiconductor region; and
   (f) an insulation film disposed at an interface between said first and third semiconductor regions.

2. A semiconductor device comprising:
   (a) a first semiconductor region of a first conductivity type;
   (b) a second semiconductor region of a second conductivity type joined with said first semiconductor region and having a pit disposed on the surface;
   (c) a conductor region embedded in the pit; and
   (d) a thin film disposed at an interface between said conductor region and said second semiconductor region and having a crystal structure different from those of said conductor region and said second semiconductor region.

3. The semiconductor device as in claim 1, wherein the thickness of said thin film is from 0.1 nm to 2 nm.

4. The semiconductor device as in claim 2, wherein the thickness of said thin film is from 0.1 nm to 2 nm.

5. The semiconductor device as in claim 1, wherein the oxygen surface concentration of said thin film is equal to or higher than $1 \times 10^{15}$ cm$^{-2}$ and equal to or lower than $4 \times 10^{15}$ cm$^{-2}$.

6. The semiconductor device as in claim 2, wherein the oxygen surface concentration of said thin film is equal to or higher than $1 \times 10^{15}$ cm$^{-2}$ and equal to or lower than $4 \times 10^{15}$ cm$^{-2}$.

7. The semiconductor device as in claim 1, wherein the oxygen surface concentration of said thin film is equal to or higher than $1 \times 10^{15}$ cm$^{-2}$ and equal to or lower than $2 \times 10^{15}$ cm$^{-2}$, and the nitrogen surface concentration of said thin film is equal to or higher than $1 \times 10^{15}$ cm$^{-2}$ and equal to or lower than $4 \times 10^{15}$ cm$^{-2}$.

8. The semiconductor device as in claim 2, wherein the oxygen surface concentration of said thin film is equal to or higher than $1 \times 10^{15}$ cm$^{-2}$ and equal to or lower than $2 \times 10^{15}$ cm$^{-2}$, and the nitrogen surface concentration of said thin film is equal to or higher than $1 \times 10^{15}$ cm$^{-2}$ and equal to or lower than $4 \times 10^{15}$ cm$^{-2}$.

9. The semiconductor device as in claim 1, wherein said second semiconductor region serves as one main electrode region of a transistor composing a memory cell, and said conductor region serves as one electrode of a charge storage capacitor section.

10. The semiconductor device as in claim 1, wherein said first and second semiconductor regions are regions made of single crystal silicon, and said conductor region is a region made of at least one of amorphous silicon and poly silicon.

11. The semiconductor device of claim 1, further comprising:
    a fourth semiconductor region of the second conductivity type joined with said first semiconductor;
    a second insulation film disposed on said first, second and fourth semiconductor region; and
    a second conductor region disposed on said second insulation film.

12. The semiconductor device as in claim 11, wherein said second semiconductor region serves as a source region of a transistor composing a memory cell and is in contact with an storage electrode of a charge storage capacitor section, said fourth semiconductor region serves as a drain region of the transistor, said second conductor region serves as a gate electrode region of the transistor, said conductor region embedded in said first and third semiconductor regions serves as the storage electrode, and said third semiconductor region serves as a plate electrode of the charge storage capacitor section.

13. The semiconductor device of claim 2, further comprising:
    a third semiconductor region of the second conductivity type joined with said first semiconductor region;
    a first insulation film disposed on said first, second and third semiconductor region;
    a second conductor region disposed on said first insulation film;
    a second insulation film disposed on said conductor region embedded in the pit; and
    a third conductor region disposed on said second insulation film.

14. The semiconductor device as in claim 13, wherein said second semiconductor region serves as a source region of a transistor composing a memory cell and is in contact with an storage electrode of a charge storage capacitor section, said third semiconductor region serves as a drain region of the transistor, said second conductor region serves as a gate electrode region of the transistor, said conductor region embedded in the pit serves as the storage electrode, and said third conductor region serves as a plate electrode of the charge storage capacitor section.

15. The semiconductor device of claim 2, further comprising:
    a third semiconductor region of the first conductivity type joined with said second semiconductor region; and
    a fourth semiconductor region of the second conductivity type joined with said third semiconductor region.

16. The semiconductor device as in claim 15, wherein said second semiconductor region serves as a collector region of a transistor, said third semiconductor region serves as a base region of the transistor, and said fourth semiconductor region serves as a emitter region of the transistor.

* * * * *